(12) United States Patent
Morgan

(10) Patent No.: US 9,595,627 B2
(45) Date of Patent: Mar. 14, 2017

(54) PHOTOVOLTAIC PANEL

(71) Applicant: John Paul Morgan, Toronto (CA)

(72) Inventor: John Paul Morgan, Toronto (CA)

(*) Notice: Subject to any disclaimer, the term of this patent is extended or adjusted under 35 U.S.C. 154(b) by 299 days.

(21) Appl. No.: 14/215,913

(22) Filed: Mar. 17, 2014

(65) Prior Publication Data

US 2014/0261630 A1    Sep. 18, 2014

Related U.S. Application Data

(63) Continuation-in-part of application No. 14/196,523, filed on Mar. 4, 2014, and a continuation-in-part of application No. 14/196,291, filed on Mar. 4, 2014, and a continuation-in-part of application No. 14/196,618, filed on Mar. 4, 2014.

(60) Provisional application No. 61/798,205, filed on Mar. 15, 2013, provisional application No. 61/948,020, filed on Mar. 4, 2014.

(51) Int. Cl.
*H01L 31/044* (2014.01)
*H01L 31/056* (2014.01)
*H01L 31/054* (2014.01)
*H01L 31/02* (2006.01)

(52) U.S. Cl.
CPC ...... *H01L 31/056* (2014.12); *H01L 31/02008* (2013.01); *H01L 31/0543* (2014.12); *H02S 20/32* (2014.12); *Y02E 10/52* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| | | |
|---|---|---|
| 4,045,245 A | 8/1977 | Coleman et al. |
| 4,148,299 A | 4/1979 | Sherman, Jr. |
| 4,337,758 A | 7/1982 | Meinel et al. |
| 4,877,460 A | 10/1989 | Flodl |
| 4,962,450 A | 10/1990 | Reshetin |
| 4,975,814 A | 12/1990 | Schairer |
| 5,197,792 A | 3/1993 | Jiao et al. |
| 5,528,057 A | 6/1996 | Yanagase et al. |
| 5,791,757 A | 8/1998 | O'Neil et al. |
| 5,897,184 A | 4/1999 | Eichenlaub et al. |
| 5,914,760 A | 6/1999 | Daiku |
| 6,008,449 A | 12/1999 | Cole |
| 6,097,549 A | 8/2000 | Jenkins et al. |
| 6,307,145 B1 | 10/2001 | Kataoka et al. |
| 6,578,989 B2 | 6/2003 | Osumi et al. |

(Continued)

FOREIGN PATENT DOCUMENTS

| | | |
|---|---|---|
| CN | 202134560 | 2/2012 |
| DE | 102006028932 | 12/2007 |

(Continued)

OTHER PUBLICATIONS

Unger, Blair L., "Dimpled Planar Lightguide Solar Concentrators", Ph.D. Dissertation, 2010, 137 pages, University of Rochester, Rochester, New York, U.S.A.

(Continued)

*Primary Examiner* — Bach Dinh

(57) ABSTRACT

A photovoltaic system comprising a first photovoltaic panel configured to collect direct light; and a second photovoltaic panel configured to collect, at least, indirect light transmitted through the one or more first photovoltaic panels.

18 Claims, 19 Drawing Sheets

(56) References Cited

U.S. PATENT DOCUMENTS

| | | |
|---|---|---|
| 6,811,277 B2 | 11/2004 | Amano |
| 6,951,415 B2 | 10/2005 | Amano et al. |
| 6,987,613 B2 | 1/2006 | Pocius et al. |
| 7,021,805 B2 | 4/2006 | Amano et al. |
| 7,072,096 B2 | 7/2006 | Holman et al. |
| 7,083,313 B2 | 8/2006 | Smith |
| 7,152,985 B2 | 12/2006 | Benitez et al. |
| 7,160,010 B1 | 1/2007 | Chinniah et al. |
| 7,290,906 B2 | 11/2007 | Suzuki et al. |
| 7,316,496 B2 | 1/2008 | Wu et al. |
| 7,391,939 B1 | 6/2008 | Williams |
| 7,431,481 B2 | 10/2008 | Stefanov |
| 7,467,879 B2 | 12/2008 | Herloski et al. |
| 7,626,761 B2 | 12/2009 | Haga et al. |
| 7,664,350 B2 | 2/2010 | Ghosh et al. |
| 7,672,549 B2 | 3/2010 | Ghosh et al. |
| 7,697,219 B2 | 4/2010 | DiDomenico |
| 7,740,392 B2 | 6/2010 | Itoh et al. |
| 7,794,100 B2 | 9/2010 | Ito |
| 7,855,335 B2 | 12/2010 | Maeda |
| 7,873,257 B2 | 1/2011 | Morgan |
| 7,925,129 B2 | 4/2011 | Ghosh et al. |
| 8,030,569 B2 | 10/2011 | Nakata |
| 8,067,688 B2 | 11/2011 | Gronet |
| 8,279,164 B2 | 10/2012 | Daiku |
| 8,412,010 B2 | 4/2013 | Ghosh et al. |
| 8,586,860 B2 | 11/2013 | Nakata |
| 8,609,455 B2 | 12/2013 | Krasnov et al. |
| 8,749,898 B2 | 6/2014 | Minano et al. |
| 8,885,995 B2 | 11/2014 | Morgan |
| 9,029,681 B1 * | 5/2015 | Nielson ............. F24J 2/06 136/246 |
| 2002/0024808 A1 | 2/2002 | Suehiro et al. |
| 2003/0047207 A1 | 3/2003 | Aylaian |
| 2006/0272698 A1 | 12/2006 | Durvasula |
| 2007/0181901 A1 | 8/2007 | Loh |
| 2007/0236927 A1 | 10/2007 | Liu |
| 2007/0256724 A1 | 11/2007 | Fork et al. |
| 2007/0256725 A1 | 11/2007 | Fork et al. |
| 2007/0256726 A1 | 11/2007 | Fork et al. |
| 2008/0087321 A1 | 4/2008 | Schwartzman |
| 2008/0149168 A1 | 6/2008 | Flaherty et al. |
| 2008/0316761 A1 | 12/2008 | Minano et al. |
| 2009/0071467 A1 | 3/2009 | Benitez et al. |
| 2009/0165842 A1 | 7/2009 | McDonald et al. |
| 2009/0213607 A1 | 8/2009 | Tatsukawa |
| 2009/0250099 A1 | 10/2009 | Pan |
| 2009/0256999 A1 | 10/2009 | Ogasawara et al. |
| 2010/0012169 A1 | 1/2010 | Jensen et al. |
| 2010/0024868 A1 | 2/2010 | Baruchi et al. |
| 2010/0051102 A1 | 3/2010 | Lin |
| 2010/0059108 A1 | 3/2010 | McDonald et al. |
| 2010/0116319 A1 | 5/2010 | Martinez Anton et al. |
| 2010/0116336 A1 | 5/2010 | Martinez Anton et al. |
| 2010/0165495 A1 | 7/2010 | Murtha |
| 2010/0170556 A1 | 7/2010 | Frolov et al. |
| 2010/0186798 A1 | 7/2010 | Tormen et al. |
| 2010/0224232 A1 | 9/2010 | Cummings et al. |
| 2011/0011449 A1 | 1/2011 | Morgan et al. |
| 2011/0044000 A1 | 2/2011 | Minano et al. |
| 2011/0096426 A1 | 4/2011 | Ghosh et al. |
| 2011/0120539 A1 * | 5/2011 | Minano ............. G01J 1/02 136/255 |
| 2011/0132432 A1 | 6/2011 | Schultz et al. |
| 2011/0155210 A1 | 6/2011 | Kim et al. |
| 2011/0155221 A1 | 6/2011 | Yu et al. |
| 2011/0214738 A1 | 9/2011 | Halahmi et al. |
| 2011/0292655 A1 | 12/2011 | Ing et al. |
| 2012/0055552 A1 | 3/2012 | Morgan et al. |
| 2012/0099325 A1 | 4/2012 | Ghosh et al. |
| 2012/0112557 A1 | 5/2012 | Sager |
| 2012/0145221 A1 | 6/2012 | Ozaki et al. |
| 2012/0145222 A1 | 6/2012 | Chen |
| 2012/0152331 A1 | 6/2012 | Luo |
| 2012/0160300 A1 | 6/2012 | Munro |
| 2012/0167949 A1 | 7/2012 | Dentinger et al. |
| 2012/0247537 A1 | 10/2012 | Mei |
| 2012/0255594 A1 | 10/2012 | Bishnoi et al. |
| 2012/0287671 A1 | 11/2012 | Parker et al. |
| 2012/0298181 A1 | 11/2012 | Cashion et al. |
| 2012/0298182 A1 | 11/2012 | Hwang |
| 2012/0312356 A1 | 12/2012 | Mizuo et al. |
| 2012/0318319 A1 | 12/2012 | Pinarbasi et al. |
| 2013/0104984 A1 | 5/2013 | Myrskog |
| 2013/0118559 A1 | 5/2013 | Castillo et al. |
| 2013/0233384 A1 | 9/2013 | Morgan et al. |
| 2013/0247960 A1 | 9/2013 | Morgan |
| 2013/0249293 A1 | 9/2013 | Yang et al. |
| 2013/0276866 A1 | 10/2013 | Maeda |
| 2013/0284237 A1 | 10/2013 | Lin et al. |
| 2013/0298901 A1 | 11/2013 | Ruiz et al. |

FOREIGN PATENT DOCUMENTS

| | | |
|---|---|---|
| EP | 1715260 | 10/2006 |
| EP | 1895228 | 3/2008 |
| EP | 2061092 | 5/2009 |
| EP | 2105682 | 9/2009 |
| EP | 2492966 | 9/2012 |
| JP | 55158681 | 12/1980 |
| JP | 02-277033 | 11/1990 |
| JP | 03-253833 | 11/1991 |
| JP | 06-160638 | 6/1994 |
| JP | 10-12024 | 1/1998 |
| JP | 11271749 | 10/1999 |
| JP | 2006114239 | 4/2006 |
| JP | 2006318807 | 11/2006 |
| JP | 2007033803 | 2/2007 |
| JP | 2010101912 | 5/2010 |
| JP | 2013080832 | 5/2013 |
| KR | 2011044502 | 4/2011 |
| WO | WO2009/002281 | 12/2008 |
| WO | WO2010033632 | 3/2010 |
| WO | WO2010033859 | 3/2010 |
| WO | WO2010124028 | 10/2010 |
| WO | WO2011011885 | 2/2011 |
| WO | WO2011022631 | 2/2011 |
| WO | WO2011120148 | 10/2011 |
| WO | WO2012014088 | 2/2012 |
| WO | WO2012085461 | 6/2012 |
| WO | WO2013010313 | 1/2013 |
| WO | WO2014005102 | 1/2014 |

OTHER PUBLICATIONS

Victoria, M. et al., "Optical Characterization of FluidReflex Concentrator", 6th International Conference on Concentrating Photovoltaic Systems, Apr. 9, 2010, 13 pages, American Institute of Physics, U.S.A.

Hallas, Justin M., et al., "Lateral Translation Micro-Tracking of Planar Micro-Optic Solar Concentrator", Proc. of SPIE vol. 7769, 2010, pp. 776904-1 to 776904-7, U.S.A.

Solfocus, webpage content, "Concentrated Photovoltaics, Solfocus", Feb. 13, 2013, 3 pages, Australia.

Winston, Roland, "Thermodynamically efficient NonImaging Optics", Dan David Symposium, University of California Merced, Sep. 26, 2008, U.S.A.

Winston, Roland, et al., "Planar Concentrators Near the étendue Limit", Optics Letters, Oct. 1, 2005, vol. 30, No. 19, pp. 2617-2619, U.S.A.

Karp, Jason, et al. "Planar Micro-Optic Solar Concentration Using Multiple Imaging Lenses into a Common Slab Waveguide", SPIE Optics and Photonics, 22 pages, Aug. 4, 2009, San Diego, U.S.A.

Sakurada et al., "Simulation of Temperature Characteristics of InGaP/InGaAs/Ge Triple-Junction Solar Cell under Concentrated Light", Japanese Journal of Applied Physics 50 (2011), Apr. 20, 2011, pp. 04DP13-1 to 04DP13-4, Japan.

(56) References Cited

OTHER PUBLICATIONS

Steiner, Marc, et al., "Increasing the Energy Yield of CPV Modules through Optimized Solar Cell Interconnection", AIP Conference Proceedings 1407 (2011), pp. 404-408, U.S.A.

* cited by examiner

PHOTOVOLTAIC PANEL

CROSS-REFERENCE TO RELATED APPLICATIONS

This application is a continuation-in-part of U.S. application Ser. No. 14/196,523 filed on Mar. 4, 2014, a continuation-in-part of U.S. application Ser. No. 14/196,291 filed on Mar. 4, 2014, and a continuation-in-part of U.S. application Ser. No. 14/196,618 filed on Mar. 4, 2014, which claims the benefit of U.S. Application No. 61/798,205 filed on Mar. 15, 2013, the contents of all of which are incorporated herein by reference in their entireties. This application also claims the benefit of U.S. Application No. 61/948,020 filed on Mar. 4, 2014, the content which is incorporated herein by reference in its entirety.

FIELD OF THE INVENTION

The present invention relates generally to photovoltaic energy, and in particular to a photovoltaic system.

BACKGROUND OF THE INVENTION

In the field of solar energy, single level photovoltaic systems have traditionally been used to generate electricity from sunlight. Such single-level systems typically comprise an array of photovoltaic cells arranged generally within a single plane, and are typically supported by a fixed support, or by a rotating support that is capable of tracking the movement of the sun. Photovoltaic arrays supported by fixed supports are generally configured to collect generally all light, while photovoltaic arrays supported by rotating supports are configured to primarily collect direct light.

Multilevel photovoltaic systems have been more recently developed, and comprise multiple arrays of photovoltaic cells distributed over two or more levels, with the different levels being configured such that both diffuse light and direct light may be collected.

Multilevel photovoltaic systems have been previously described. For example, U.S. Patent Application Publication No. 2010/0012169 to Jensen et al. describes a solar energy system for capturing an increased amount of solar energy in an area. A device for collecting obscured solar radiation and converting it into usable electrical energy includes a major concentrated solar energy system combined with a minor solar energy system. In one embodiment, the minor solar energy system includes a primary mirror, secondary mirror and a second photocell. Primary and secondary mirrors of a minor solar energy system are defined by their location, at least a portion of which may be substantially within the concave region of the secondary mirror of a major solar energy system.

U.S. Patent Application Publication No. 2010/0186798 to Tormen et al. describes a photovoltaic device optical system for enhanced light harvesting with a transparent layer of dielectric material having on one side an array of micro-lenses and on the opposite side a metal reflective film with an array of openings. The micro-lenses focus direct sunlight impinging thereon through the openings, to separate direct sunlight and diffuse sunlight. The photovoltaic device has a first photovoltaic cell system for the exploitation of the direct sunlight located in the opposite hemi-space of the micro-lenses array with respect to the plane of the openings array, and a second photovoltaic cell system for the exploitation of diffuse sunlight, located in the same hemi-space containing the micro-lens array with respect to the plane of the openings array.

German Patent Application No. 102006028932 to Doerr describes a module having one or more photovoltaic elements configured to transmit a portion of light focused by a convergent lens. The module has a reflector spaced from the photovoltaic elements, which have a glass substrate. The photovoltaic elements carry a support element in an adjustable position. The photovoltaic elements have an active layer with a thickness of between 5 and 60 micrometers.

Improvements are generally desired. It is therefore an object at least to provide a novel photovoltaic system.

SUMMARY OF THE INVENTION

In one aspect, there is provided a photovoltaic system comprising: a first photovoltaic panel configured to collect direct light; and a second photovoltaic panel configured to collect, at least, indirect light transmitted through the first photovoltaic panel.

The first photovoltaic panel may be a concentrated photovoltaic panel. The first photovoltaic panel may comprise one or more high-efficiency photovoltaic elements. The second photovoltaic panel may be a non-concentrated photovoltaic panel. The second photovoltaic panel may comprise one or more silicon photovoltaic elements.

The first photovoltaic panel may be mounted on a rotating support configured for sun tracking. The second photovoltaic panel may be mounted to a back side of the first photovoltaic panel, the first photovoltaic panel and the second photovoltaic panel being mounted on the rotating support. The second photovoltaic panel may comprise one or more bifacial photovoltaic elements. Each bifacial cell may comprise a front face oriented toward the first photovoltaic panel, and a back face oriented away from the first photovoltaic panel. The back face may be configured to collect light reflected from the ground.

The second photovoltaic panel may be mounted in a fixed relationship relative to the ground. The second photovoltaic panel may be mounted to a support post of the rotating support. The system may further comprise a ground support stand supporting the second photovoltaic panel.

The first photovoltaic panel may comprise: at least one rigid sheet; one or more first optical elements disposed adjacent a first side of the at least one rigid sheet; one or more second optical elements disposed adjacent a second side of the at least one rigid sheet; and one or more high-efficiency photovoltaic elements, each high-efficiency photovoltaic element disposed between a respective first optical element and a respective second optical element, each first optical element comprising at least one lens configured to focus light impinging thereon onto a corresponding reflecting surface of the respective second optical element, each second optical element being configured to reflect light focused by the first optical element to the high-efficiency photovoltaic element.

The at least one lens may be configured to focus direct light impinging thereon onto the corresponding reflecting surface of the respective second optical element.

The at least one lens may comprise a generally ring-shaped, plano-convex lens arranged concentrically about a central axis of the first optical element. The lens may comprise a convex surface defined as a surface of full revolution around the central axis. The convex surface may be spaced radially from the central axis. The lens may comprise a planar surface that is co-planar with a planar back surface of the first optical element. The planar back surface may be oriented towards and generally parallel with the at least one rigid sheet. The at least one lens may comprise a plurality of generally ring-shaped, plano-convex lenses arranged concentrically about the central axis.

The at least one reflecting surface may comprise an annular reflecting surface arranged concentrically about a central axis of the second optical element. The annular reflecting surface may be defined as a surface of revolution around the central axis. Each second optical element may further comprise an inner reflecting surface configured to reflect light reflected by the annular reflecting surface to the high-efficiency photovoltaic element. The inner annular reflecting surface may be defined as a surface of revolution around the central axis. The at least one reflecting surface may be configured to reflect light by total internal reflection. Each second optical element may be positioned such that the central axis is generally collinear with a central axis of the respective first optical element. Each high-efficiency photovoltaic element may be positioned on the collinear central axes.

The system may further comprise a compliant layer disposed between the first optical element and the at least one rigid sheet. The compliant layer may comprise an elastomeric material. The may further comprise a compliant layer disposed between the second optical element and the at least one rigid sheet. The compliant layer may comprise an elastomeric material.

The at least one rigid sheet may comprise a first rigid sheet spaced from and parallel with a second rigid sheet, the one or more high-efficiency photovoltaic elements being disposed between the first and second rigid sheets. The system may further comprise an elastomeric layer disposed between the first and second rigid sheets.

The system may further comprise structure configured to conduct heat away from the high-efficiency photovoltaic element. The structure may be a conductor grid providing an electrical connection to the high-efficiency photovoltaic element. The structure may comprise a plurality of strips extending outwardly from the high-efficiency photovoltaic element. The strips may extend radially outwardly from the high-efficiency photovoltaic element. The structure may further comprise a first arc and a second arc attached to the strips.

BRIEF DESCRIPTION OF THE DRAWINGS

Embodiments will now be described more fully with reference to the accompanying drawings in which.

DETAILED DESCRIPTION OF THE EMBODIMENTS

Figure 1:
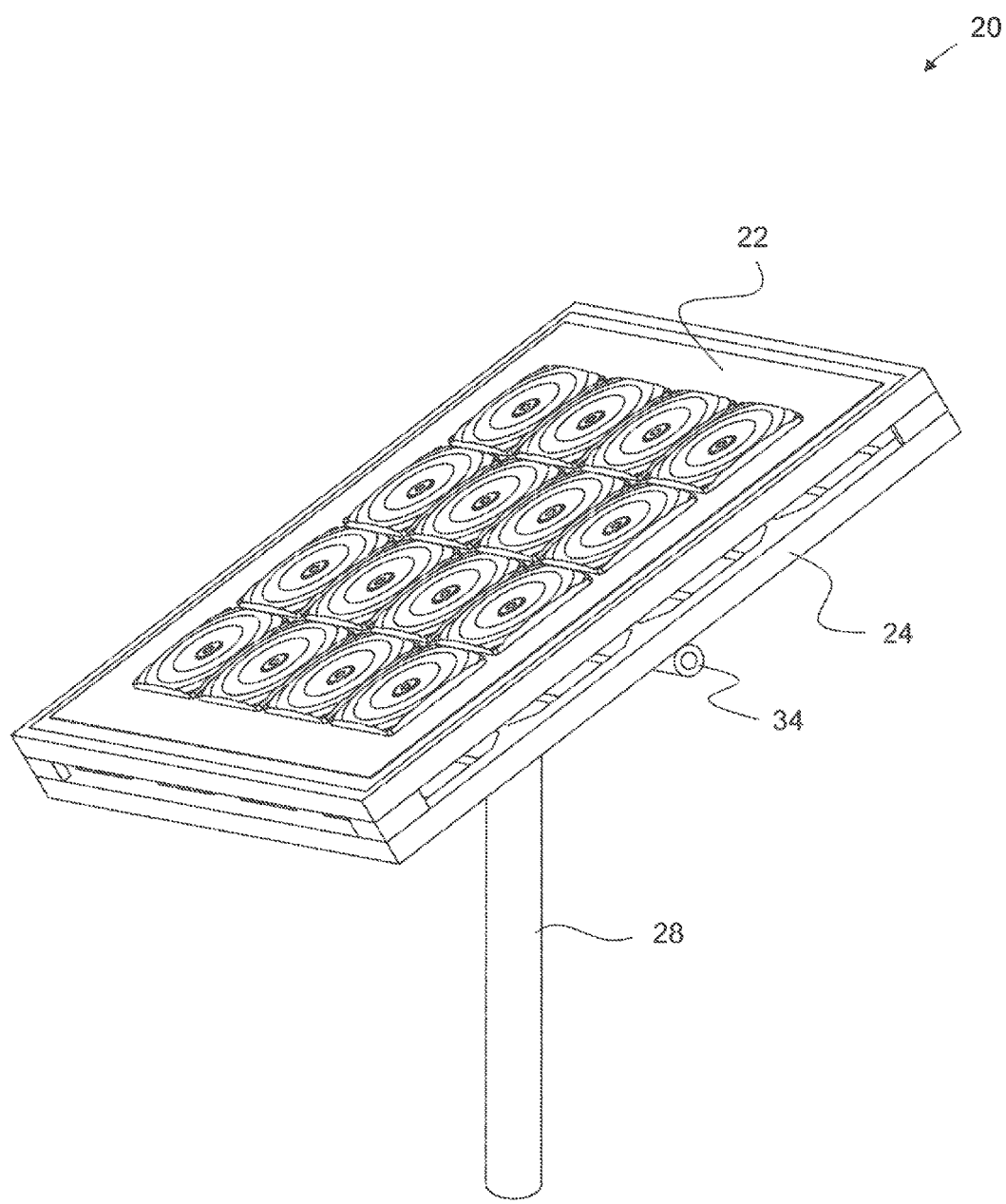
FIG. 1 is a front perspective view of a photovoltaic system.
Figure 2:
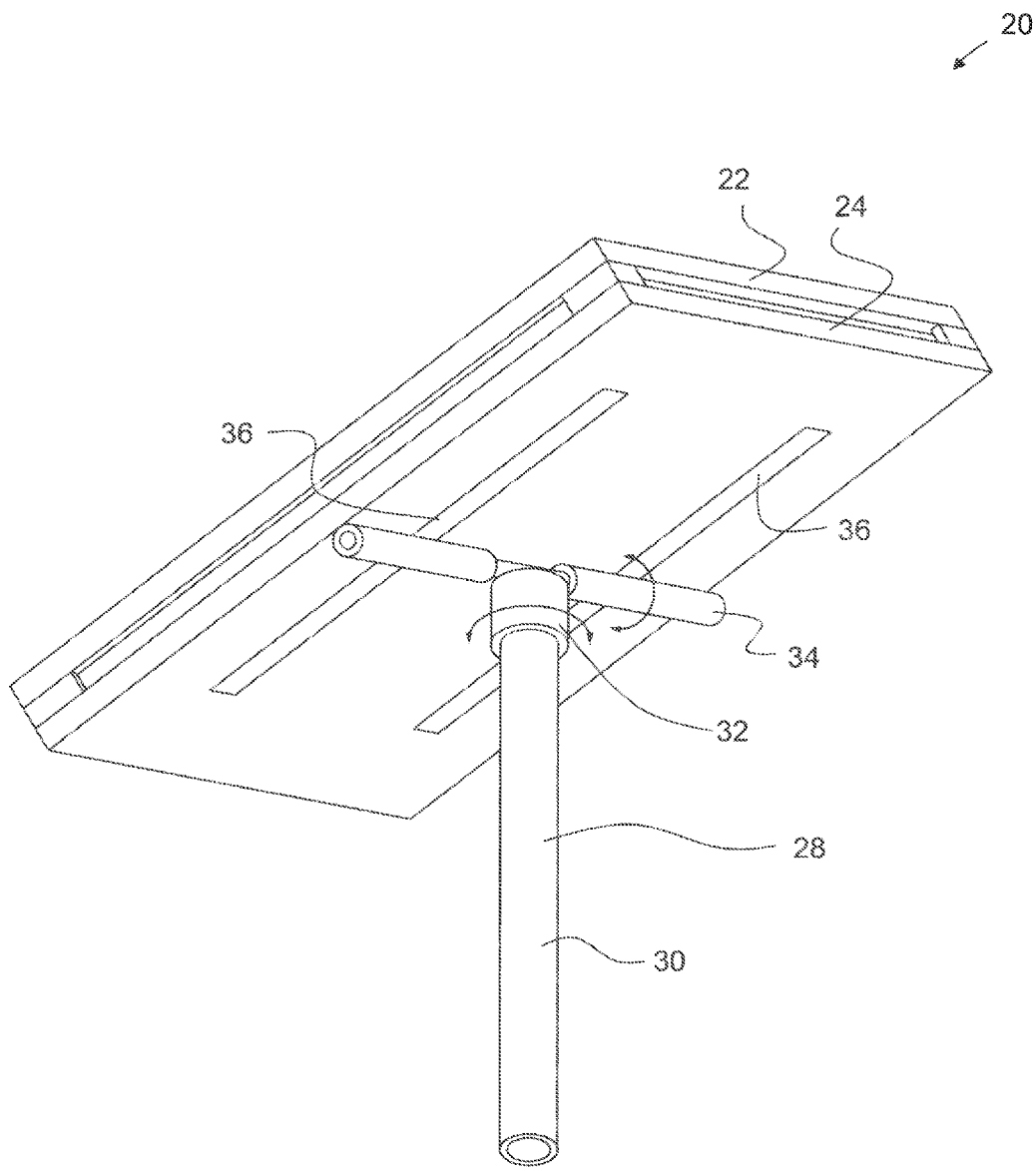
FIG. 2 is a rear perspective view of the photovoltaic system of FIG. 1.
Figure 3:
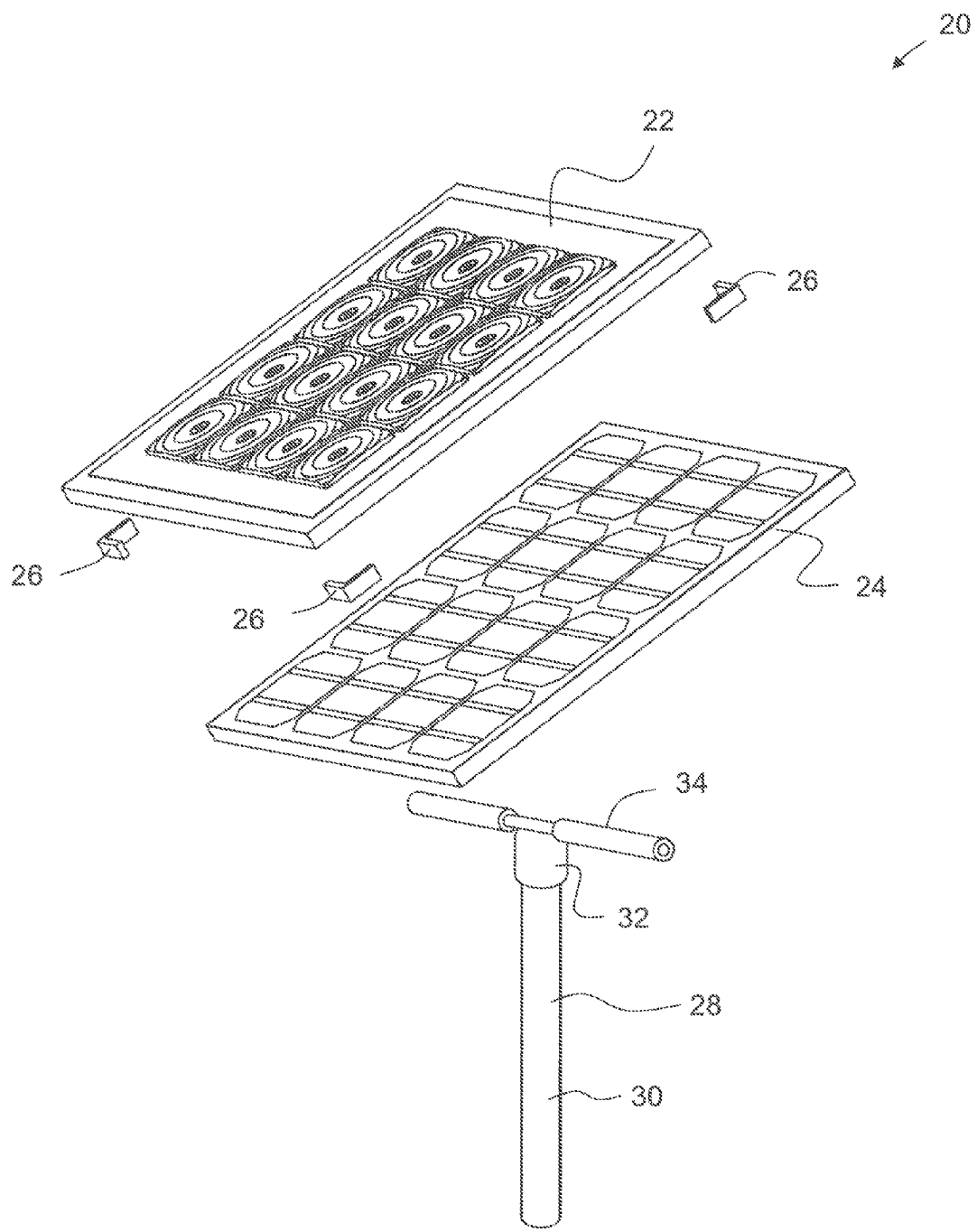
FIG. 3 is an exploded view of the photovoltaic system of FIG. 1; f2
Figure 4:
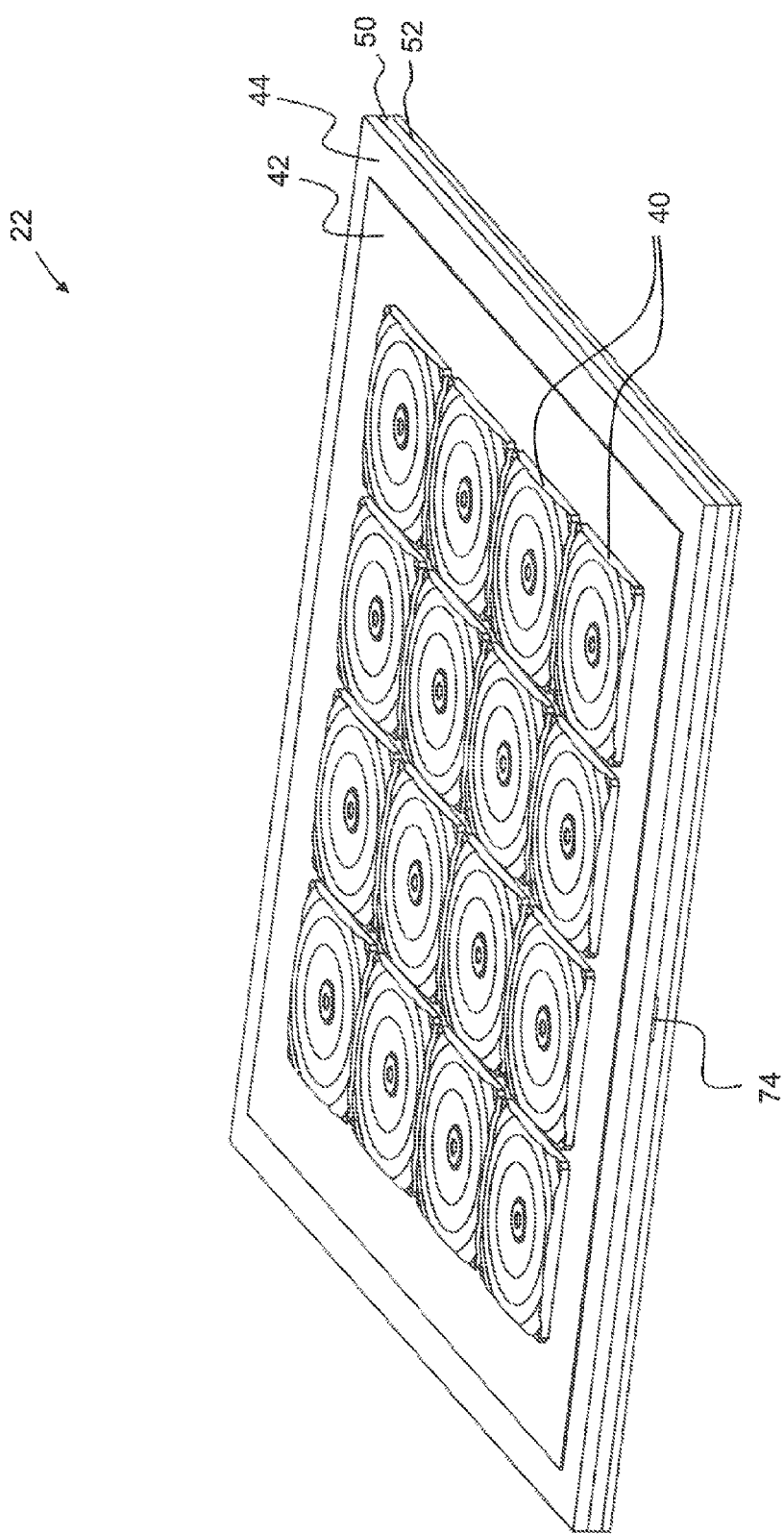
FIG. 4 is a perspective view of a concentrated photovoltaic panel forming part of the photovoltaic system of FIG. 1.
Figure 5:
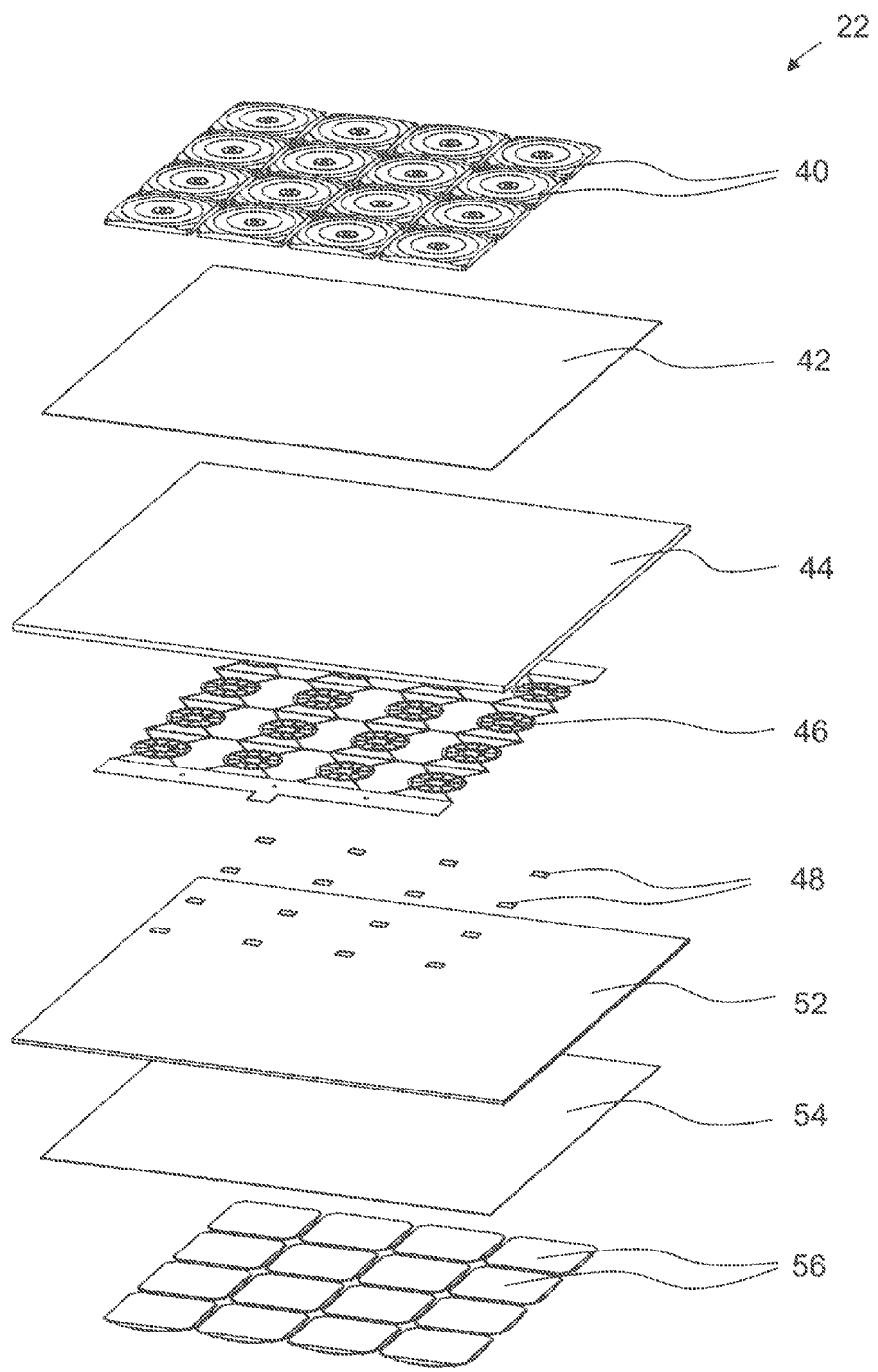
FIG. 5 is an exploded view of a portion of the concentrated photovoltaic panel of FIG. 4.
Figure 6A:
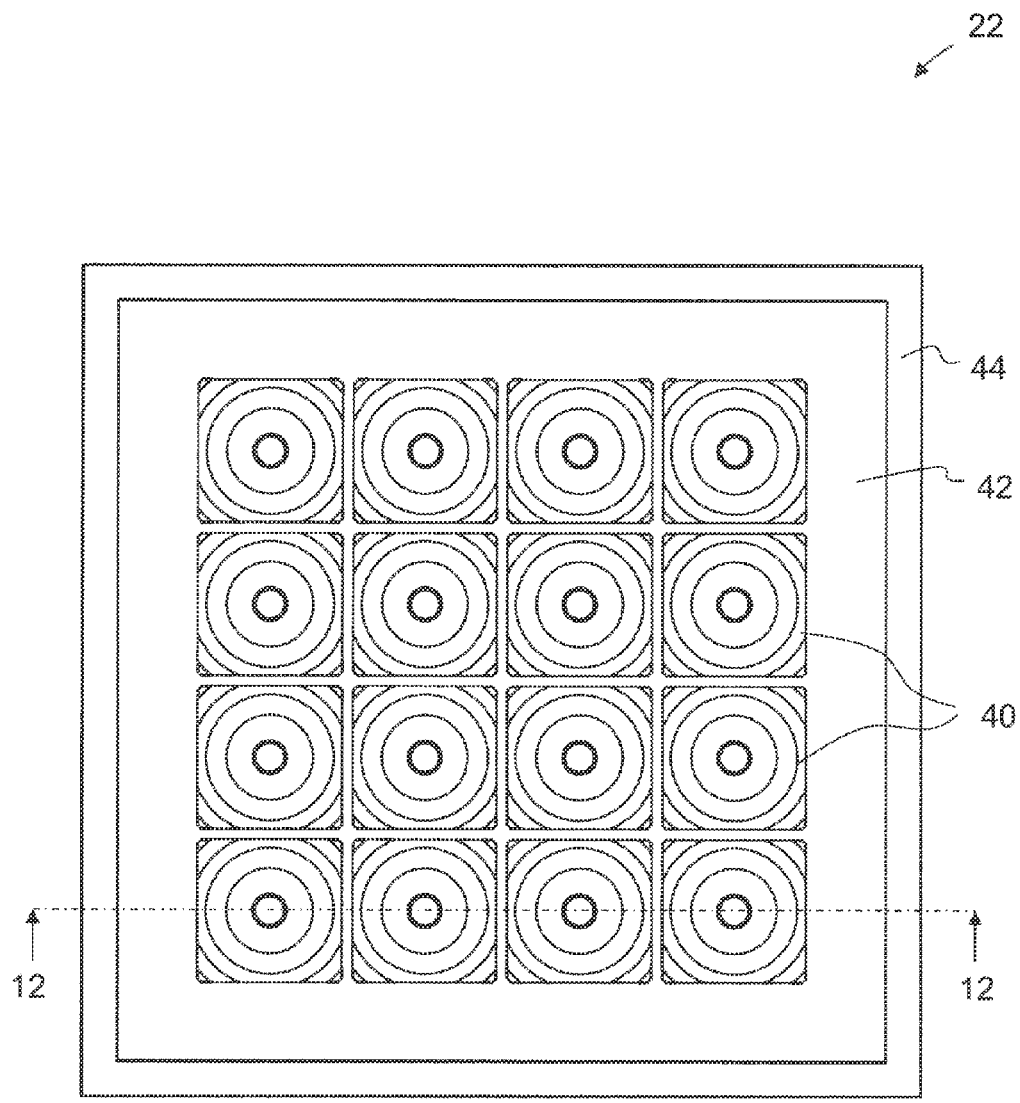
FIGS. 6A and 6B are top plan and bottom plan views, respectively, of the concentrated photovoltaic panel of FIG. 4.
Figure 6B:
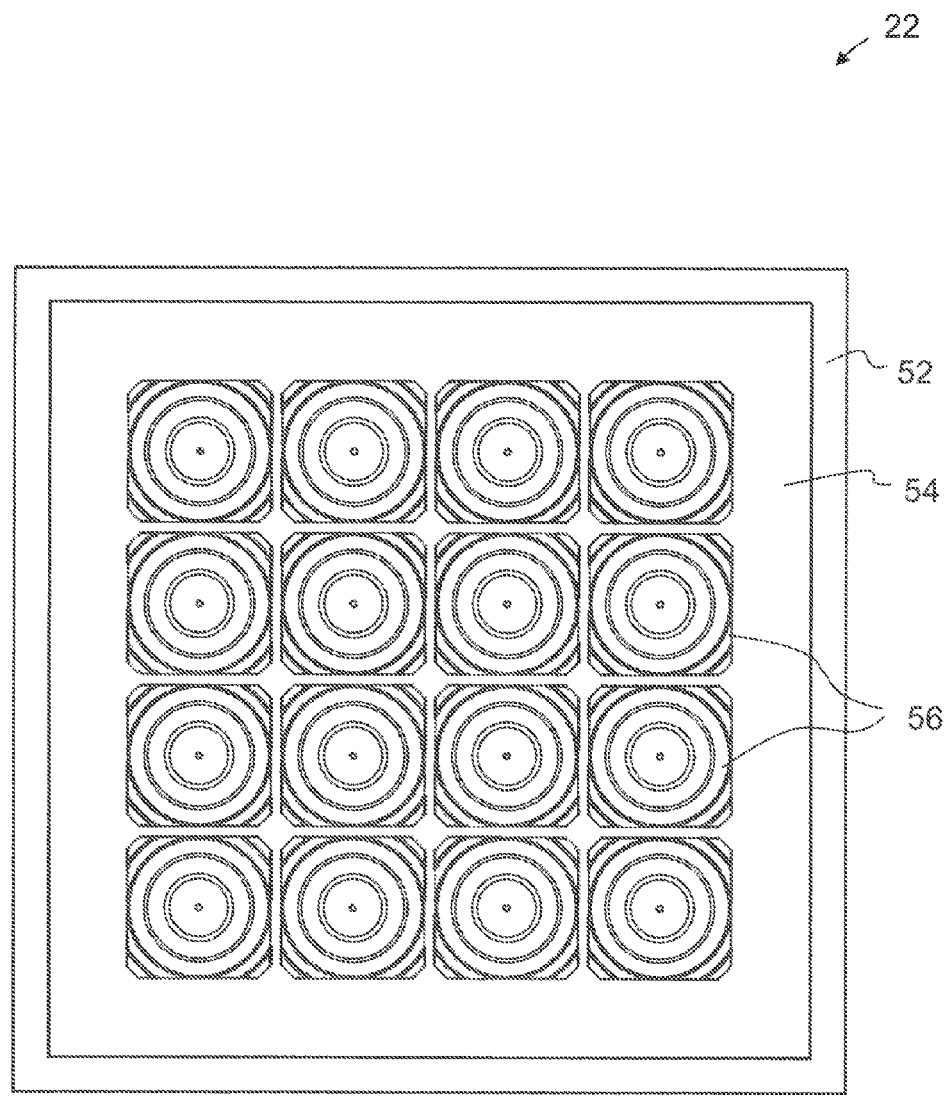
Figure 7:
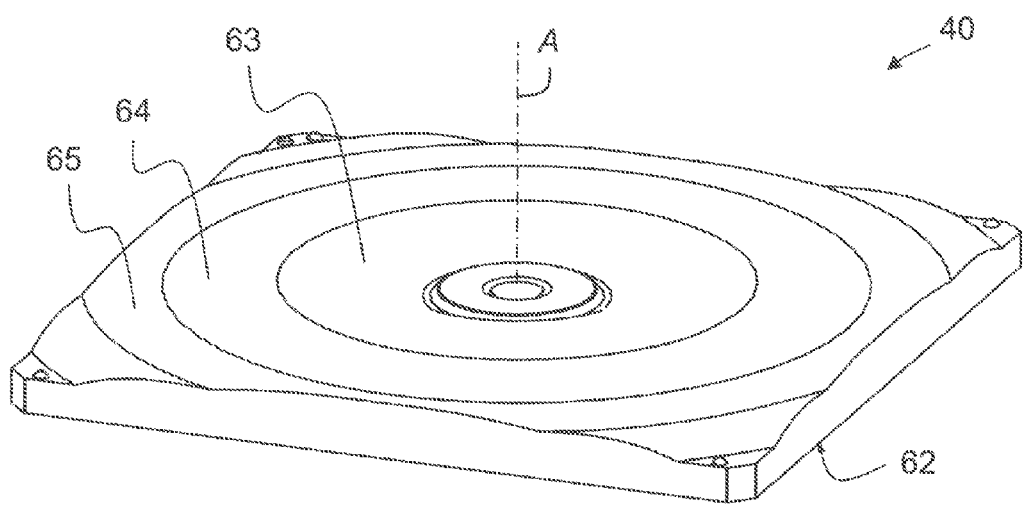
FIG. 7 is a perspective view of a first optical element forming part of the concentrated photovoltaic panel of FIG. 4.
Figure 8:
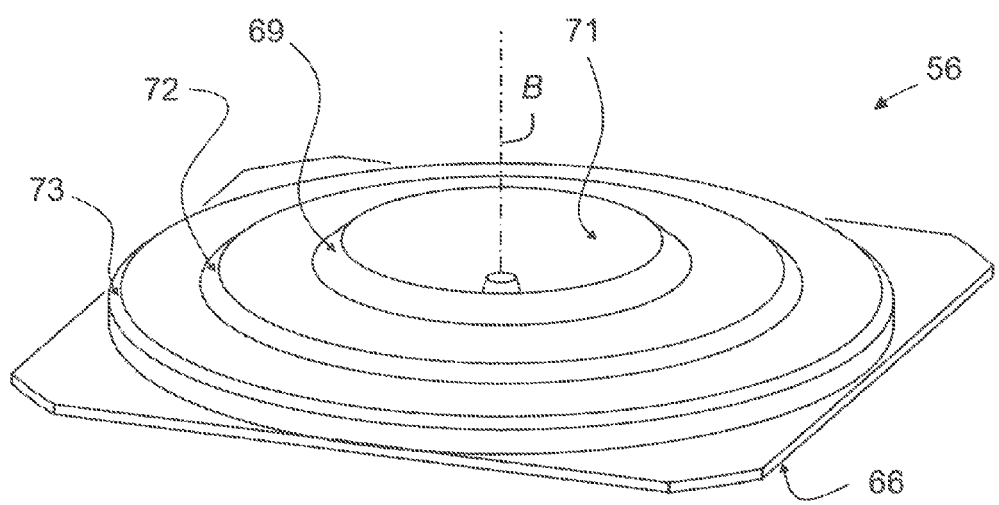
FIG. 8 is a perspective view of a second optical element forming part of the concentrated photovoltaic panel of FIG. 4.
Figure 9:
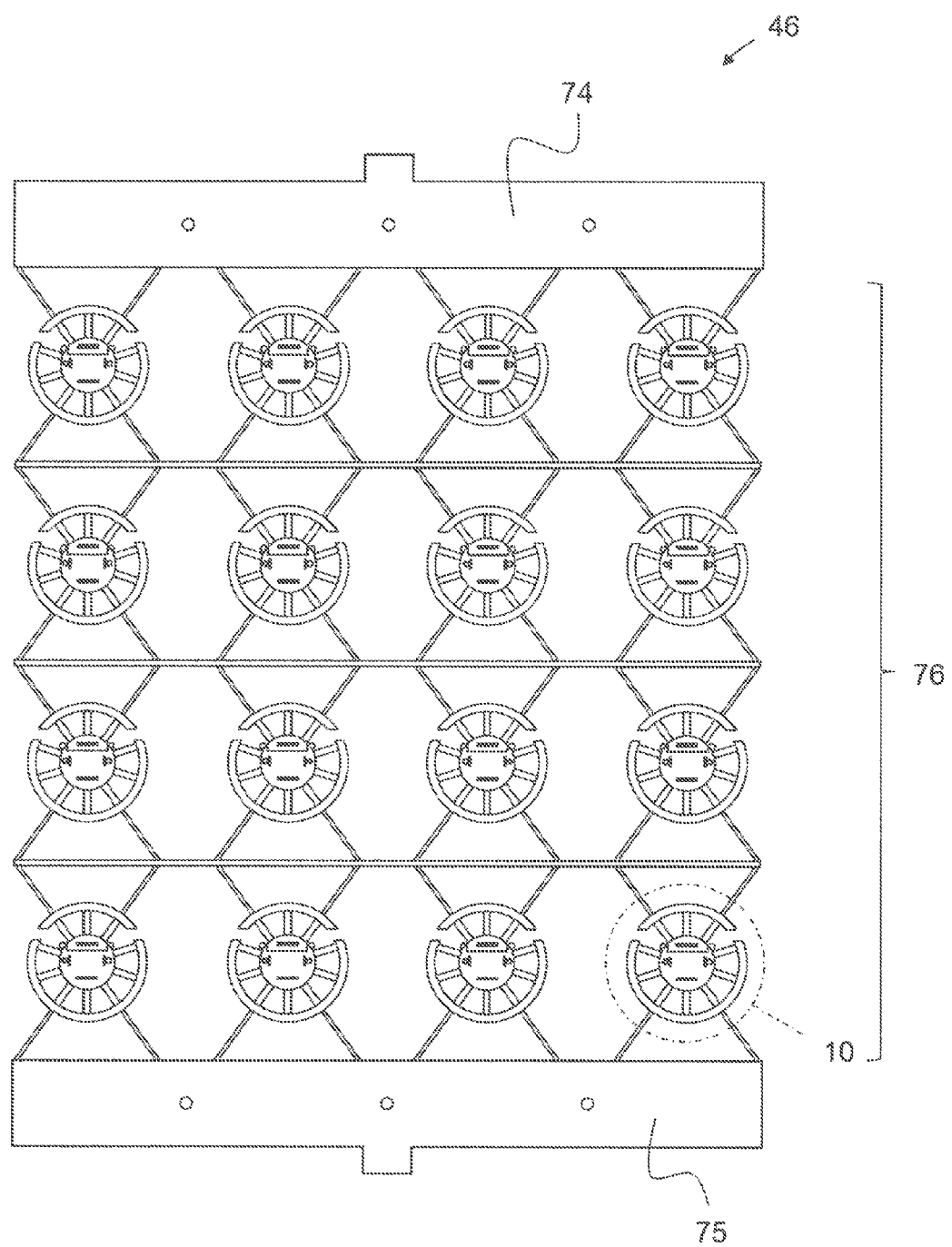
FIG. 9 is a top plan view of a conductor grid forming part of the concentrated photovoltaic panel of FIG. 4.
Figure 10:
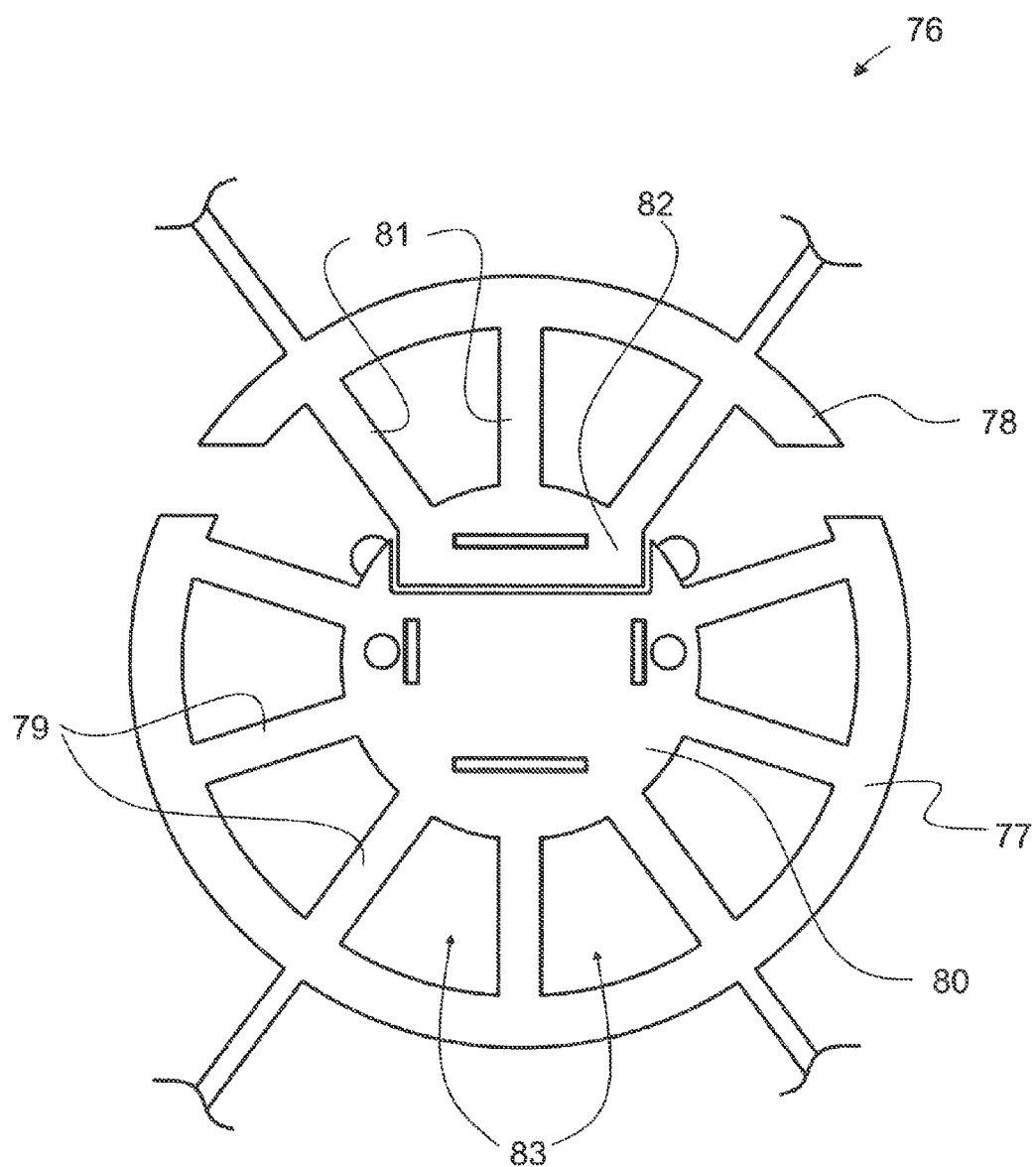
FIG. 10 is an enlarged fragmentary view of a portion of the conductor grid of FIG. 9 identified by reference numeral 10.
Figure 11:
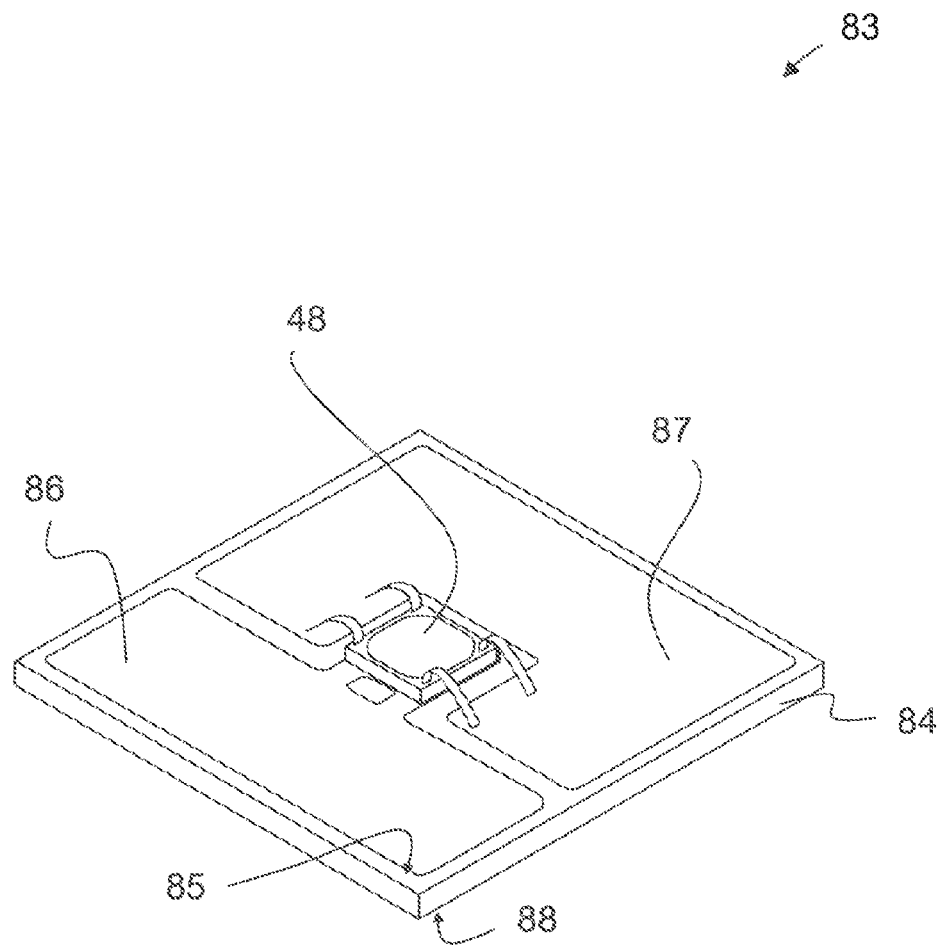
FIG. 11 is a is a perspective view of a receiver forming part of the concentrated photovoltaic panel of FIG. 4.
Figure 12:
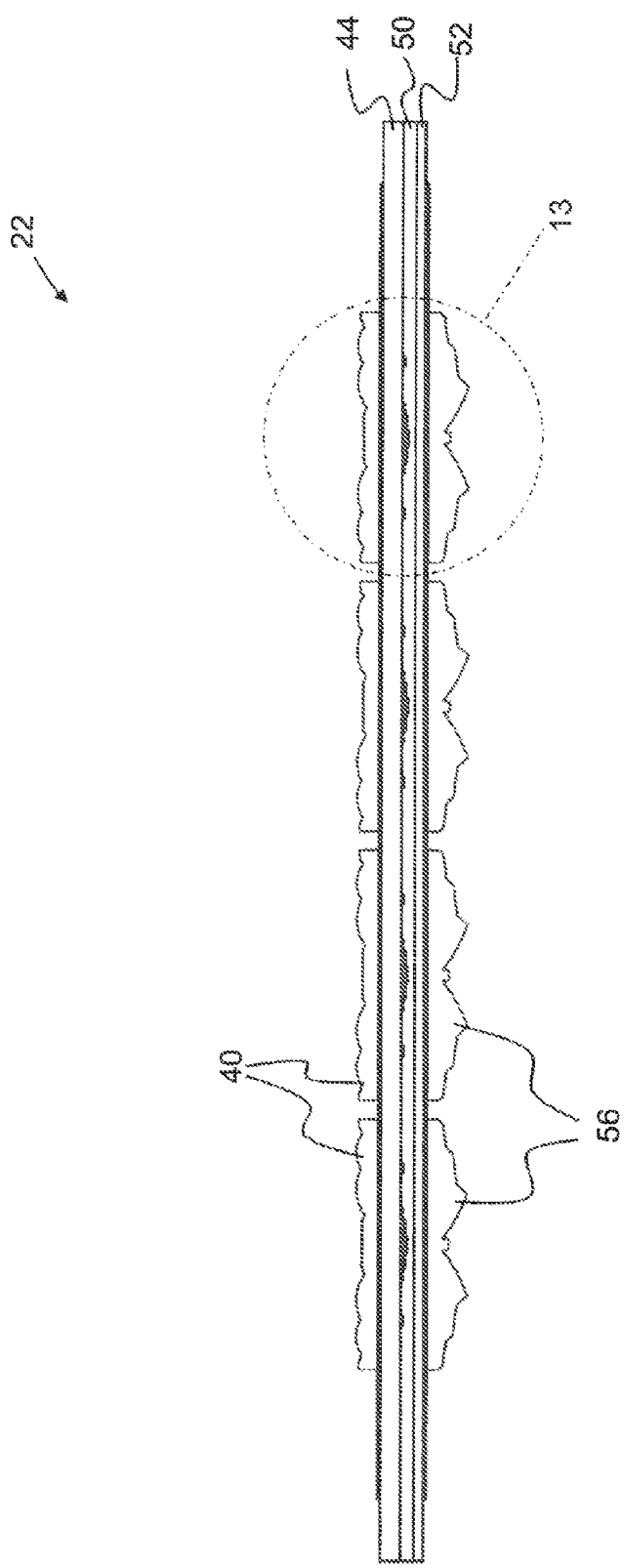
FIG. 12 is a sectional side view of the concentrated photovoltaic panel of FIG. 6A, taken along the indicated section line.
Figure 13:
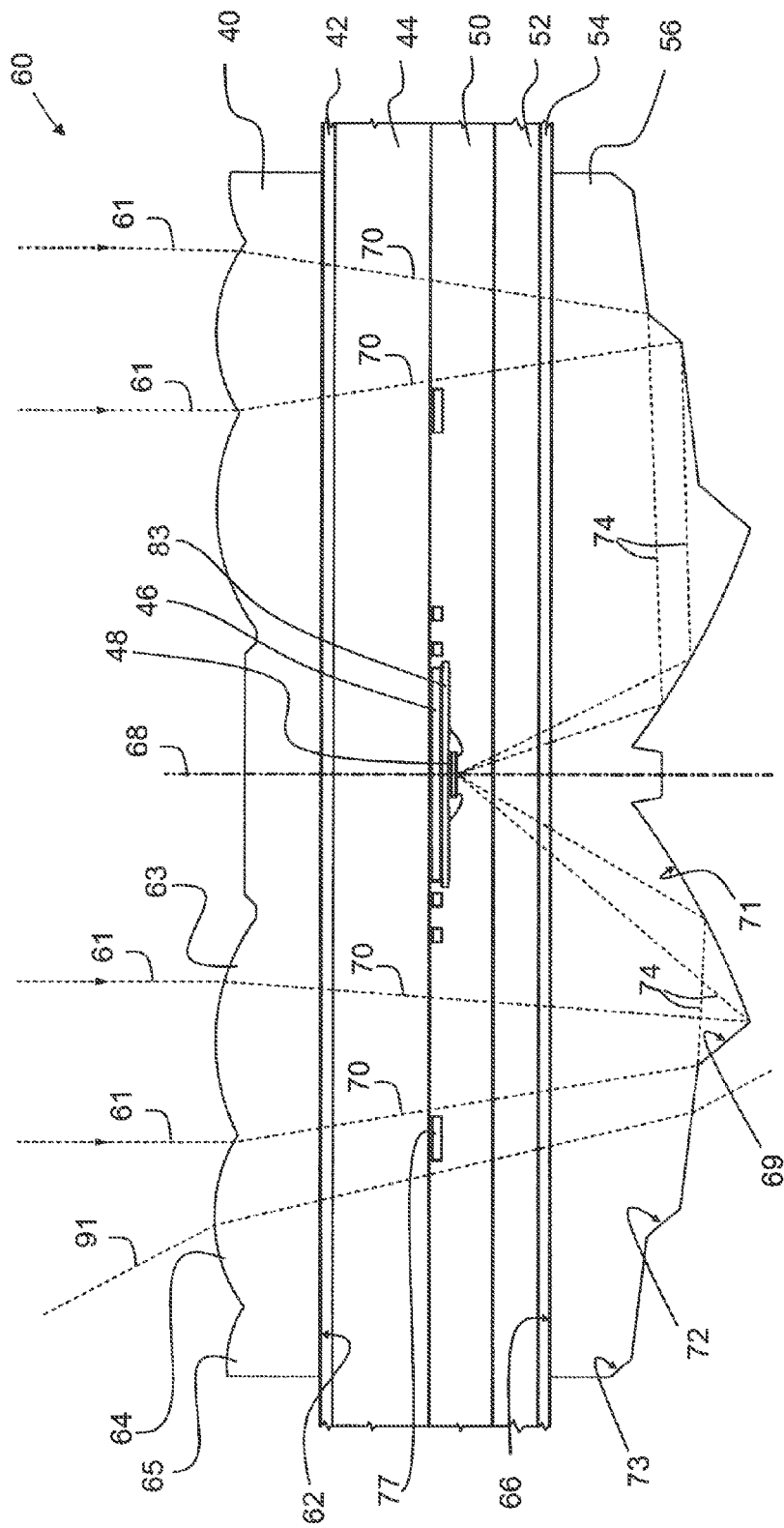
FIG. 13 is an enlarged fragmentary view of a portion of the concentrated photovoltaic panel of FIG. 12 identified by reference numeral 13, showing light rays.

Turning now to FIGS. 1 to 14, a photovoltaic system is shown and is generally indicated by reference numeral 20. Photovoltaic system 20 comprises a concentrated photovoltaic panel that is configured to collect direct light, and a non-concentrated photovoltaic panel that is configured to collect, at least, indirect light transmitted through the concentrated photovoltaic panel. Specifically, the system 20 comprises a first photovoltaic panel 22 comprising a plurality of concentrated, generally transparent photovoltaic collectors each having a first photoelectric element and being configured to collect direct light, and a second photovoltaic panel 24 comprising a plurality of second photovoltaic elements configured to collect, at least, indirect light transmitted through the first photovoltaic panel.

In this embodiment, the first and second photovoltaic panels 22 and 24 are mounted in fixed relation to each other in a spaced, generally parallel relationship by four (4) corner brackets 26, and the first and second photovoltaic panels 22 and 24 are sized so as to have generally the same area. The second photovoltaic panel 24 is mounted adjacent a back side of the first photovoltaic panel 22, such that indirect light transmitted through the first photovoltaic panel 22 is collected by the second photovoltaic panel 24.

The system 20 also comprises a rotating support 28 on which the first photovoltaic panel 22 and the second photovoltaic panel 24 are mounted, and which is capable of tracking movement of the sun. In particular, the rotating support 28 is configured to be rotated during use such that a front side of the first photovoltaic panel 22 is generally oriented toward the sun during at least some daylight hours, so as to enable direct light, and specifically direct sunlight, to be collected by the first photovoltaic panel 22. In the embodiment shown, the rotating support 28 comprises a longitudinal support post 30, atop of which is coupled a motorized first rotating member 32 configured to move rotatably about a first axis (not shown), and a motorized second rotating member 34 coupled to the first rotating member 32 and configured to move rotatably about a second ax (not shown). Two (2) support arms 36 extend from the second rotating member 34 and provide surfaces to which an underside of the second photovoltaic panel 24 is mounted.

The system 20 further comprises a controller unit (not shown) in communication with the rotating support 28, which is configured to control operation of the motorized first rotating member 32 and the motorized second rotating member 34 for generally orienting the first and second photovoltaic panels 22 and 24 in unison toward the sun, so as to enable direct light, and specifically direct sunlight, to be collected by the first photovoltaic panel 22.

The first photovoltaic panel 22 may be better seen in FIGS. 4 to 13. The first photovoltaic panel 22 comprises one or more first optical elements 40, an elastomeric first compliant layer 42, a first rigid sheet 44, a conductor grid 46, one or more first photovoltaic elements 48, an intermediate layer 50 (not shown in FIG. 5), a second rigid sheet 52, an elastomeric second compliant layer 54, and one or more second optical elements 56, all of which are arranged in a generally stacked manner. The components of the first photovoltaic panel 22 are configured as one or more concentrated photovoltaic collectors 60, each of which is configured to collect and concentrate direct light, and in particular direct sunlight, for generating electricity by the photovoltaic effect. Each collector 60 comprises a respective first optical element 40, a respective second optical element 56, and a respective first photovoltaic element 48 disposed generally therebetween. In the embodiment shown, the first photovoltaic panel 22 comprises sixteen (16) concentrated photovoltaic collectors 60 arranged in a four-by-four (4×4) array.

Each first optical element 40 is fabricated of a light-transmissive material, and is shaped so as to comprise a plurality of generally ring-shaped lenses that are arranged in a concentric manner about a central axis A. Each lens has an optical axis (not shown) that is parallel with the central axis A, and each lens is configured to focus direct light 61 impinging thereon onto a corresponding reflecting surface of a respective second optical element 56. Here, it will be understood that direct light refers to light impinging on the first optical element 40 that is generally parallel with the optical axis of the lens, and therefore generally parallel with the central axis A of the first optical element 40. Reciprocally, it will be understood that indirect light refers to light that is non-parallel with the optical axis of the lens, and therefore non-parallel with the central axis A of the first optical element 40. The first optical element 40 has a planar back surface 62 that is perpendicular to the central axis A.

In this embodiment, each first optical element 40 comprises three (3) lenses, namely a first lens 63, a second lens 64 and a third lens 65. Each of the lenses 63, 64 and 65 is a generally ring-shaped, plano-convex lens and has a convex surface defined as a surface of full revolution around the central axis A, and a planar surface that is co-planar with the planar back surface 62. As may be seen, the convex surface of each of the lenses 63, 64 and 65 is spaced from the central axis A along the radial direction. Additionally, and as may be seen, the lenses 63 and 64 each have a convex surface defined as a surface of full revolution around the central axis A, while the lens 65 has a convex surface defined as a surface of full revolution around the central axis A, and which is truncated tangentially to the direction of revolution.

In this embodiment, each first optical element 40 is fabricated of polymethyl methacrylate (PMMA).

Each first optical element 40 is disposed on the first compliant layer 42 disposed on the first rigid sheet 44, such that the planar back surface 62 is oriented towards and is generally parallel with the first rigid sheet 44. The first compliant layer 42 and the first rigid sheet 44 are each fabricated of a light-transmissive material, and in this embodiment, the first compliant layer 42 is a silicone layer and the first rigid sheet 44 is a glass plate.

The first rigid sheet 44 and the second rigid sheet 52 are spaced from each other in a parallel relationship. The intermediate layer 50 is disposed between the first rigid sheet 44 and the second rigid sheet 52, and generally encapsulates the conductor grid 46 and the one or more first photovoltaic elements 48. An elastomeric, second compliant layer 54 is disposed on the second rigid sheet 52. The second rigid sheet 52, the intermediate layer 50 and the second compliant layer 54 are each fabricated of a light-transmissive material, and in this embodiment, the second rigid sheet 52 is a glass plate, and each of the intermediate layer 50 and the second compliant layer 54 is a layer of silicone.

In this embodiment, the first compliant layer 42 serves as an adhesive to bond the first optical elements 40 to the first rigid sheet 44, and the second compliant layer 54 serves as an adhesive to bond the second optical elements 56 to the second rigid sheet 52. As a result of their elastomeric nature, each of the compliant layers 42 and 54 effectively provides a buffer that allows differences in thermal expansion between the optical element and the rigid sheet to be accommodated while maintaining the mechanical integrity of the first photovoltaic panel 22 and while generally maintaining optical alignment of the components thereof. As will be understood, silicone can accommodate an elastic elongation of about 500% without mechanical failure, which in this embodiment effectively permits each of the compliant layers 42 and 54 to expand by up to about 500%, as necessary, while maintaining the mechanical bonds at the interfaces between the optical elements and the rigid sheets. Additionally, each of the compliant layers 42 and 54 facilitates the emission of thermal energy from the first and second rigid sheets 44 and 52, and therefore facilitates the dissipation of heat from the first photovoltaic panel 22.

Each second optical element 56 is disposed on the second compliant layer 54 disposed on the second rigid sheet 52, such that its planar back surface 66 is oriented towards and is generally parallel with the second rigid sheet 52. Each second optical element 56 is fabricated of a light-transmissive material, and in this embodiment the second optical element 56 is fabricated of PMMA. The second optical element 56 is shaped so as to comprise a plurality of annular reflecting surfaces that are arranged in a concentric manner about a central axis B. Each second optical element 56 is positioned relative to a corresponding first optical element 40 within the collector 60, such that its central axis B is generally collinear with the central axis A of the first optical element 40, and so as to define a central axis 68 of the collector 60. The annular reflecting surfaces are configured to reflect direct light focused by the first optical element 40 to the first photovoltaic element 48. The planar back surface 66 of the second optical element 56 is perpendicular to the central axis B.

In this embodiment, each second optical element 56 comprises four (4) annular reflecting surfaces each defined as a surface of revolution around the central axis B. The four (4) annular reflecting surfaces comprise a first reflecting surface 69 configured to reflect direct light 70 focused by the first lens 63 to an inner reflecting surface 71, a second reflecting surface 72 configured to reflect direct light 70 focused by the second lens 64 to the inner reflecting surface 71, and a third reflecting surface 73 configured to reflect direct light 70 focused by the third lens 65 to the inner reflecting surface 71. The inner reflecting surface 71 is configured to reflect direct light 74 reflected by the first, second and third reflecting surfaces 69, 72 and 73 to the first photovoltaic element 48. As will be understood, the first, second and third reflecting surfaces 69, 72 and 73, and the inner reflecting surface 71, are configured to reflect direct light focused by the first optical element 40 by total internal reflection (TIR). As may be seen, each of the four (4) reflecting surfaces 69, 71, 72 and 73 is defined as a surface of full revolution around the central axis B, and is radially spaced from the central axis B.

The conductor grid 46 is fabricated of an electrically and thermally conductive material, and is electrically connected to the first photovoltaic elements 48. The conductor grid 46 is positioned within the first photovoltaic panel 22 such that each first photovoltaic element 48 is generally centered at the normal axis 68 of a respective collector 60. The conductor grid 46 is disposed against the first rigid sheet 44 and is otherwise generally encapsulated by the intermediate layer 50, and in this embodiment the conductor grid 46 comprises a pattern of stamped copper foil that is bonded to the first rigid sheet 44 by an adhesive layer (not shown). The conductor grid 46 comprises a positive bus bar 74, a negative bus bar 75, and further comprises a plurality of interconnection traces 76 connecting the first photovoltaic elements 48, either directly or indirectly, to the bus bars 74 and 75.

Surrounding each first photovoltaic element 48 within the conductor grid 46 is a positive arc 77 and a negative arc 78. Connected to the positive arc 77 is a first plurality of radial strips 79, which in turn is connected to a positive terminal 80 that is electrically connected, either directly or indirectly, to the first photovoltaic element 48. Similarly, connected to the negative arc 78 is a second plurality of radial strips 81, which in turn is connected to a negative terminal 82 that is connected, either directly or indirectly, to the first photovoltaic element 48. As will be understood, the positive and negative arcs 77 and 78, the strips 79 and 81, and the positive and negative terminals 80 and 82 electrically connect each first photovoltaic element 48 to the bus bars 74 and 75, and also conduct heat away from the first photovoltaic element 48 so as to maintain the first photovoltaic element 48 at a suitable temperature for efficient operation. As will be understood, gaps 83 between the radial strips 79 and 81, the positive and negative arcs 77 and 78, and the positive and negative terminals 80 and 82 facilitate heat dissipation from the conductor grid 46 to surrounding portions of the first photovoltaic panel 22, and also provide windows through which light may be transmitted, such as direct light 70 focused by the first optical element 40 onto the second optical element 56, and indirect light. In this manner, the radial strips 79 and 81, the positive and negative arcs 77 and 78, and the positive and negative terminals 80 and 82 surrounding each first photovoltaic element 48 effectively serve as a "heat spreader" for the first photovoltaic element 48.

In this embodiment, the first photovoltaic panel 22 comprises one or more receivers 83 (not shown in FIG. 5), with each receiver 83 supporting and electrically connecting a first photovoltaic element 48 to the conductor grid 46. Each receiver 83 comprises a frame 84 configured to hold the first photovoltaic element 48 and to dissipate heat therefrom. On a front side 85 of the frame 84 is a positive terminal 86 and a negative terminal 87, each of which is electrically connected to a respective positive terminal (not shown) and negative terminal (not shown) of the first photovoltaic element 48. In this embodiment, the outwardly-facing surface of the first photovoltaic element 48 is negative, and is electrically connected to the negative terminal 87. On a back side 88 of the frame 84 is a positive contact (not shown) and a negative contact (not shown), each contact being respectively connected to the positive terminal 86 and the negative terminal 87, and each contact being configured to be electrically connected to a respective one of the positive and negative terminals 80 and 82 of the conductor grid 46. In this embodiment, the receiver 83 is constructed by placing the first photovoltaic element 48 on the frame 84, and then wire bonding the first photovoltaic element 48 to metal leads. The receiver 83 may be bonded to the positive and negative terminals 80 and 82 of the conductor grid 46 from the back side 88 of the frame 84 by soldering or by means of an electrically conductive adhesive, and/or the receiver 83 may include crimping features (not shown) configured to engage slots within the positive and negative terminals 80 and 82.

Each first photovoltaic element 48 is a high-efficiency photovoltaic cell that is configured to convert light absorbed therein into an electrical current by the photovoltaic effect. In this embodiment, each first photovoltaic element 48 is a GaInP/GaInAs/Ge triple junction photovoltaic cell.

Figure 14:
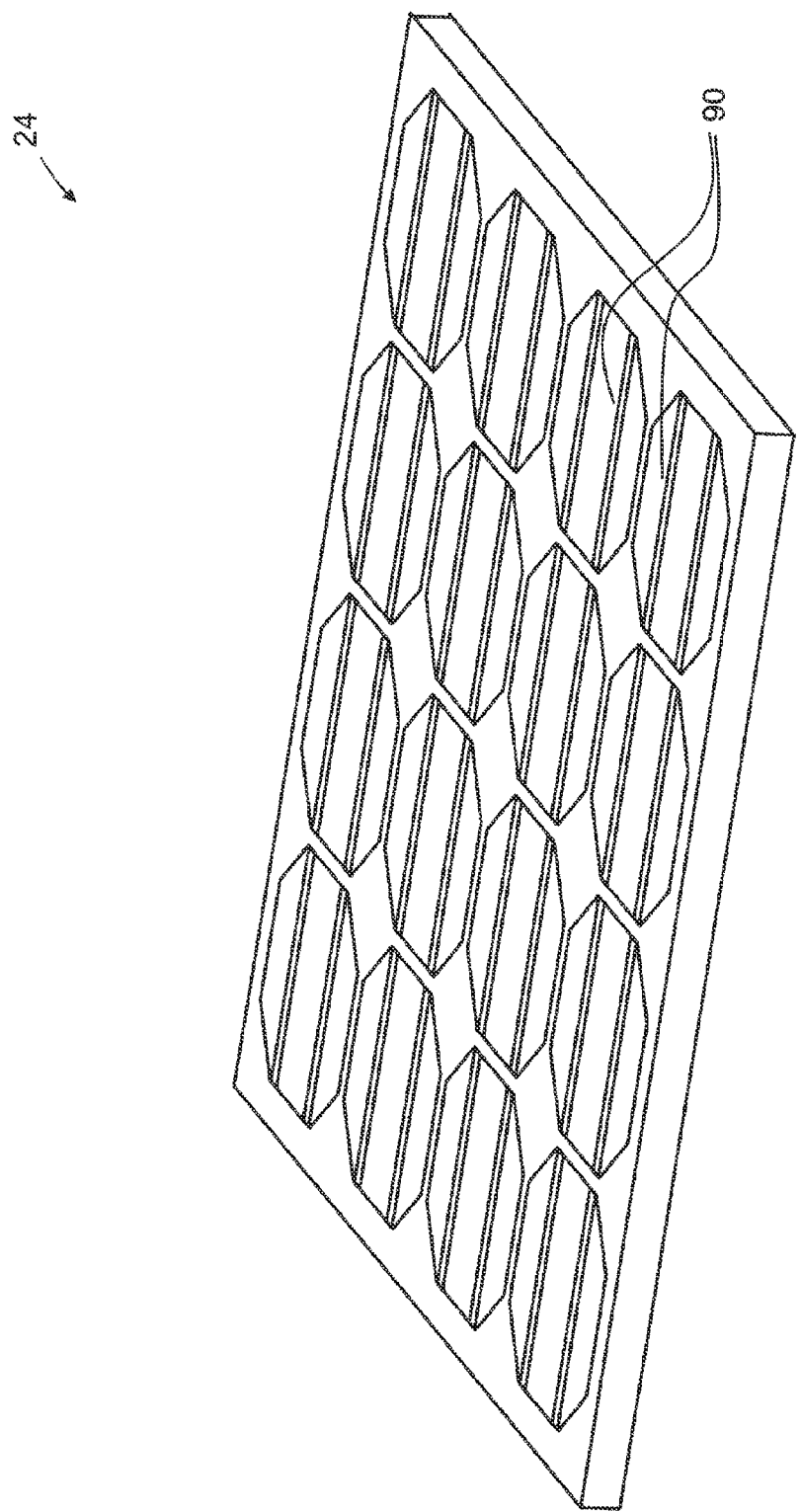
FIG. 14 is a perspective view of a conventional photovoltaic panel forming part of the photovoltaic system of FIG. 1.

Turning now to FIG. 14, the second photovoltaic panel 24 may be better seen. The second photovoltaic panel 24 comprises a plurality of second photovoltaic elements 90, each second photovoltaic element 90 being a conventional photovoltaic cell that is configured to convert light absorbed therein into an electrical current by the photovoltaic effect. In this embodiment, each second photovoltaic element 90 is a monocrystalline or polycrystalline silicon photovoltaic cell. The second photovoltaic elements 90 are electrically connected to a suitable conventional conductor structure (not shown) for drawing electrical current therefrom.

The system 20 further comprises a system power circuit (not shown) that is electrically connected to the bus bars 74 and 75 of the first photovoltaic panel 22 for drawing electrical current therefrom, and to the conventional conductor structure of the second photovoltaic panel 24 for drawing electrical current therefrom. The system power circuit is electrically connected to a conventional electrical storage structure (not shown) configured to store at least some of the drawn electrical current, and/or is electrically connected to a conventional power distribution grid (not shown). The conventional electrical storage structure may comprise, for example, one or more batteries.

In use, the motorized first and second rotating members 32 and 34 of the rotating support 28 are rotated by the controller unit such that the front side of the first photovoltaic panel 22 is generally oriented toward the sun, so as to enable direct light, and specifically direct sunlight, to be collected by the first photovoltaic panel 22. Within each collector 60 of the first photovoltaic panel 22, direct light 61 impinging on the first lens 63 is focused through the first compliant layer 42, the first rigid sheet 44, the intermediate layer 50, the second rigid sheet 52, and the second compliant layer 54, onto the first reflecting surface 69, and is in turn reflected to the first photovoltaic element 48 via reflection by the inner reflecting surface 71. Similarly, direct light 61 impinging on the second lens 64 and the third lens 65 is focused onto the second reflecting surface 72 and the third reflecting surface 73, respectively, and is in turn reflected to the first photovoltaic element 48 via reflection by the inner reflecting surface 71. The first photovoltaic element 48 absorbs light impinging thereon and generates an electrical current. The electrical current generated by the first photovoltaic elements 48 is drawn from the first photovoltaic panel 22 through the conductor grid 46 via the positive and negative bus bars 74 and 75 to the system power circuit.

Indirect light 91 impinging on the first optical element 40 is generally transmitted through the collector 60, and therefore through the first photovoltaic panel 22, without being focused onto any of the annular reflecting surfaces 58, 62 or 64 and reflected to the first photovoltaic element 48. At least some of the indirect light 91 transmitted through the first photovoltaic panel 22 impinges on a front side of the second photovoltaic panel 24. The second photovoltaic elements 90 of the second photovoltaic panel 24 absorb light impinging thereon and generate an electrical current. The electrical current generated by the second photovoltaic elements 90 is drawn from the second photovoltaic panel 24 through the conventional conductor structure to the system power circuit.

As will be appreciated, the configuration of the radial strips 79 and 81 within the collector 60 allows thermal energy to be conducted from the first photovoltaic element 48 more effectively, as compared to conventional concentrated photovoltaic cells that rely on an air gap between optical elements and the photovoltaic element for heat dissipation. Additionally, the first and second compliant layers 42 and 54 further allow thermal energy to be conducted from the first photovoltaic element 48 more effectively, as they allow heat to be transferred from one material to another more effectively as compared to prior art concentrated photovoltaic panels that comprise air gaps between their optical layers. Further, and as will be appreciated, the radial strips 79 and 81 provide paths within the collector 60 for conduction of thermal energy from, and for conduction of electrical current to and from, the first photovoltaic element 48, while advantageously reducing the amount of non-transparent material used within the collector 60 for improving the transparency of the first photovoltaic panel 22 to both direct light and indirect light.

As will be appreciated, components of the first photovoltaic panel 22 and the second photovoltaic panel 24, with the general exception of the first photovoltaic elements 48, are fabricated of materials that are generally inexpensive. Additionally, the efficiency of the collector 60 permits the size of the first photovoltaic element 48 to be reduced. As a result, the photovoltaic system 20 may advantageously be manufactured at a relatively low cost, as compared to conventional photovoltaic systems.

Figure 15:
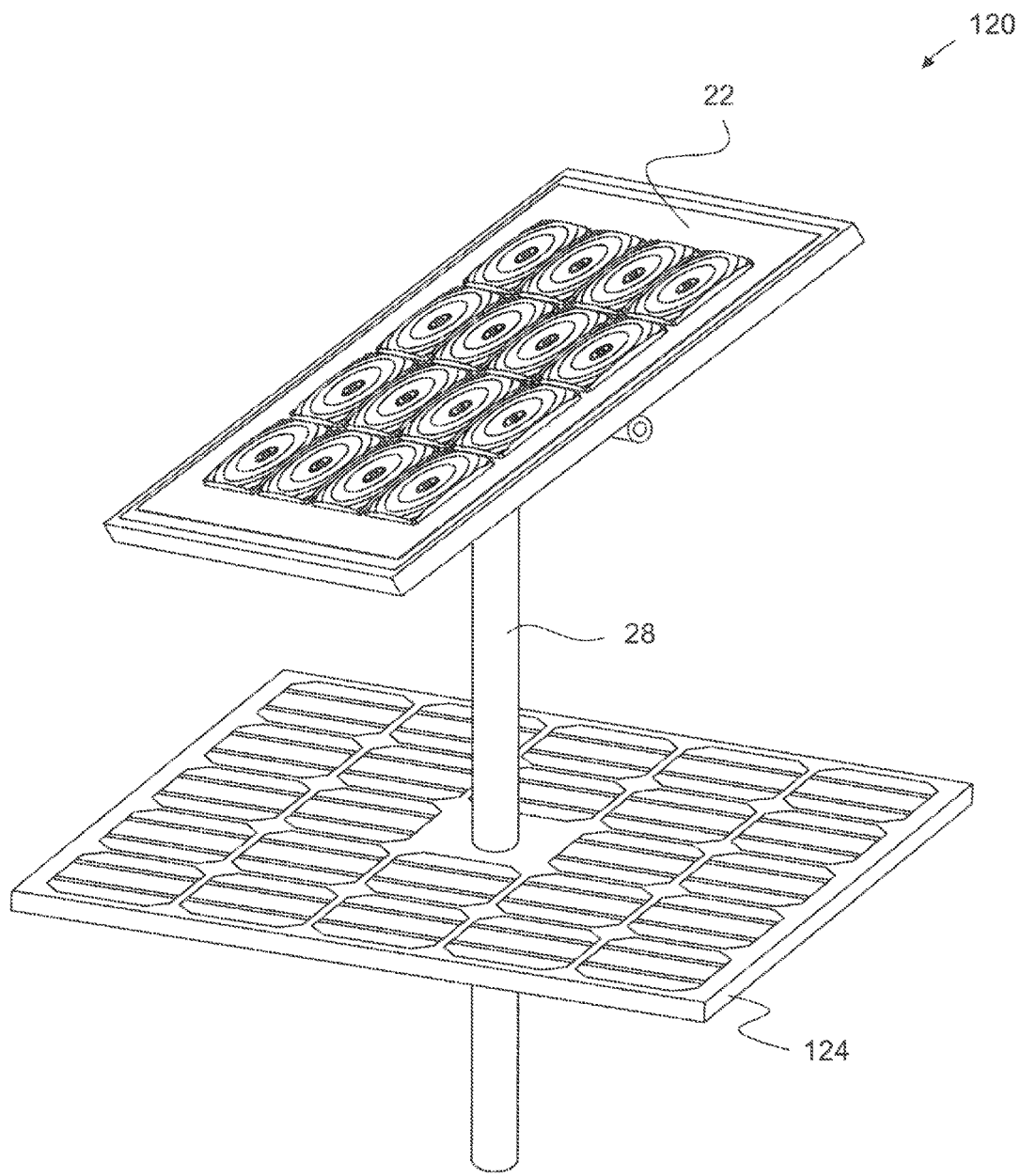
FIG. 15 is a front perspective view of another embodiment of a photovoltaic system.
Figure 16:
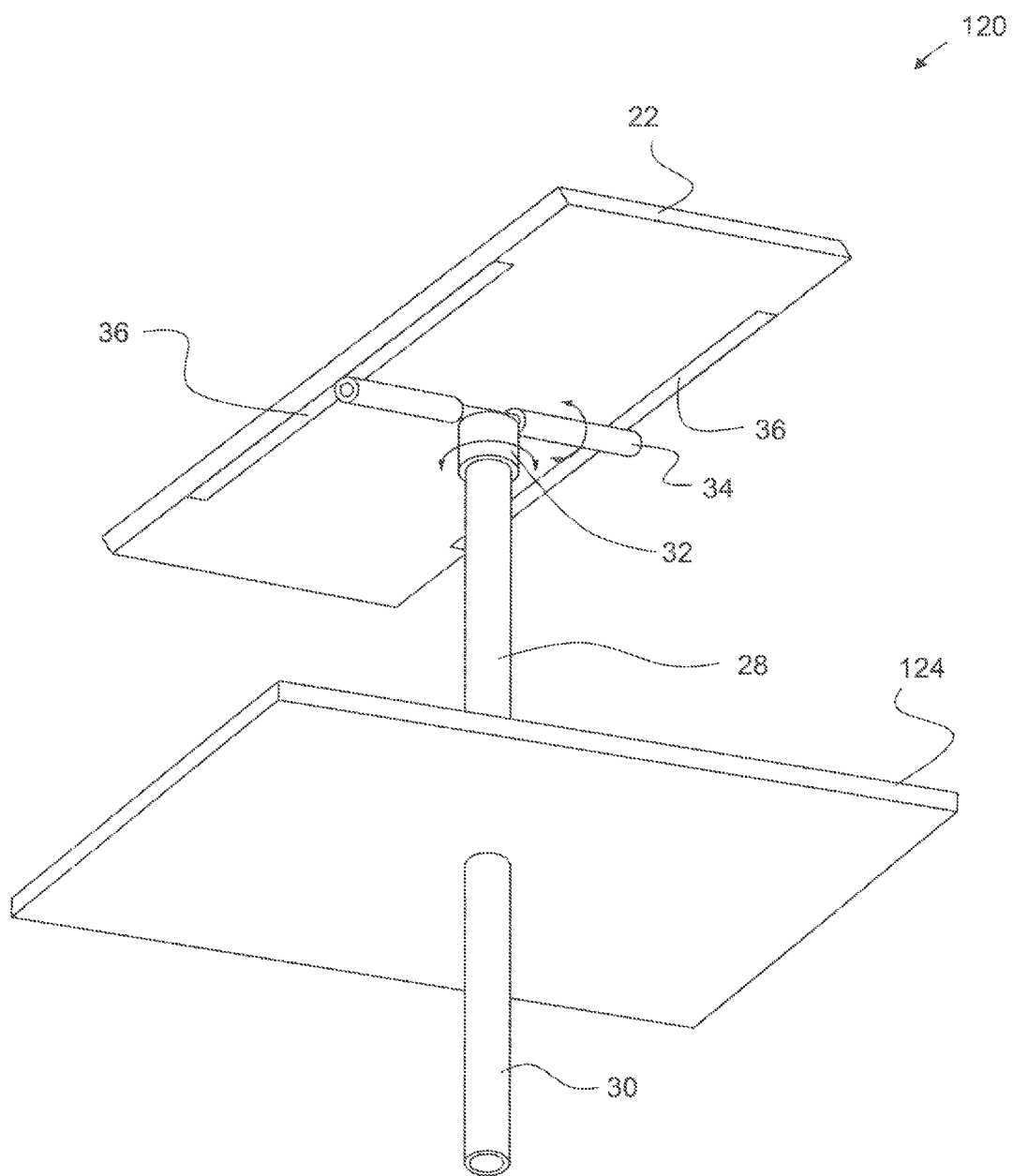
FIG. 16 is a rear perspective view of the photovoltaic system of FIG. 15.

Other configurations are possible. For example, FIGS. 15 and 16 show another embodiment of a photovoltaic system, which is generally indicated by reference numeral 120. Photovoltaic system 120 is generally similar to photovoltaic system 20 described above and with reference to FIGS. 1 to 14, and comprises a concentrated photovoltaic panel that is configured to collect direct light, and a non-concentrated photovoltaic panel that is configured to collect, at least, indirect light transmitted through the concentrated photovoltaic panel. Specifically, the system 120 comprises a first photovoltaic panel 22 comprising a plurality of concentrated, generally transparent photovoltaic collectors each having a first photoelectric element and being configured to collect direct light, and a second photovoltaic panel 124 comprising a plurality of second photovoltaic elements configured to collect, at least, indirect light transmitted through the first photovoltaic panel. In this embodiment, the first photovoltaic panel 22 and the second photovoltaic panel 124 are mounted in a non-fixed relation to each other, and the first and second photovoltaic panels 22 and 24 are sized so as to have generally different areas. The second photovoltaic panel 124 is mounted generally behind the first photovoltaic panel 22, such that indirect light transmitted through the first photovoltaic panel 22 is collected by the second photovoltaic panel 124. The second photovoltaic panel 124 may also collect light that is impinges thereon without being transmitted through the first photovoltaic panel 22.

The system 120 also comprises a rotating support 28 on which the first photovoltaic panel 22 is mounted, and which is capable of tracking movement of the sun. In particular, the rotating support 28 is configured to be rotated during use such that a front side of the first photovoltaic panel 22 is generally oriented toward the sun during at least some daylight hours, so as to enable direct light, and specifically direct sunlight, to be collected by the first photovoltaic panel 22. The rotating support 28 comprises a longitudinal support post 30, atop of which is coupled a motorized first rotating member 32 configured to move rotatably about a first axis (not shown), and a motorized second rotating member 34 coupled to the first rotating member 32 and configured to move rotatably about a second ax (not shown). Two (2) support arms 36 extend from the second rotating member 34 and provide surfaces to which an underside of the first photovoltaic panel 24 is mounted. The second photovoltaic panel 124 is mounted to the support post 30 of the rotating support 28 in a fixed position. In the embodiment shown, the second photovoltaic panel 124 is mounted generally horizontally and in a fixed position relative to the ground.

The system 120 further comprises a controller unit (not shown) in communication with the rotating support 28, which is configured to control operation of the motorized first rotating member 32 and the motorized second rotating member 34 for generally orienting the first photovoltaic panel 22 toward the sun, so as to enable direct light, and specifically direct sunlight, to be collected by the first photovoltaic panel 22.

The first photovoltaic panel 22 has been described above and with reference to FIGS. 1 to 14.

The second photovoltaic panel 124 is generally similar to the second photovoltaic panel 24 described above and with reference to FIGS. 1 to 14, but is further configured to be mounted to the support post 30 of the rotating support 28. In the embodiment shown, the second photovoltaic panel 124 comprises a central aperture accommodating the support post 30. Those skilled in the art will appreciate that in other embodiments, the aperture accommodating the support post may be located elsewhere within the panel, or that the panel may alternatively not comprise any aperture and may alternatively be fixedly mounted to the support post of the rotating support in another manner.

The system 120 further comprises a system power circuit (not shown) that is electrically connected to the bus bars 74 and 75 of the first photovoltaic panel 22 for drawing electrical current therefrom, and to the conventional conductor structure of the second photovoltaic panel 124 for drawing electrical current therefrom. The system power circuit is electrically connected to a conventional electrical storage structure (not shown) configured to store at least some of the drawn electrical current, and/or is electrically connected to a conventional power distribution grid (not shown). The conventional electrical storage structure may comprise, for example, one or more batteries.

In use, the motorized first and second rotating members 32 and 34 of the rotating support 28 are rotated by the controller unit such that the front side of the first photovoltaic panel 22 is generally oriented toward the sun, so as to enable direct light, and specifically direct sunlight, to be collected by the first photovoltaic panel 22, in the manner described above and with reference to FIGS. 1 to 14. Each first photovoltaic element 48 absorbs light impinging thereon and generates an electrical current. The electrical current generated by the first photovoltaic elements 48 is drawn from the first photovoltaic panel 22 through the conductor grid 46 via the positive and negative bus bars 74 and 75 to the system power circuit. At least some indirect light transmitted through the first photovoltaic panel 22 impinges on a front side of the second photovoltaic panel 124. The second photovoltaic elements 90 of the second photovoltaic panel 124 absorb light impinging thereon and generate an electrical current. The electrical current generated by the second photovoltaic elements 90 is drawn from the second photovoltaic panel 124 through the conventional conductor structure to the system power circuit.

Figure 17:
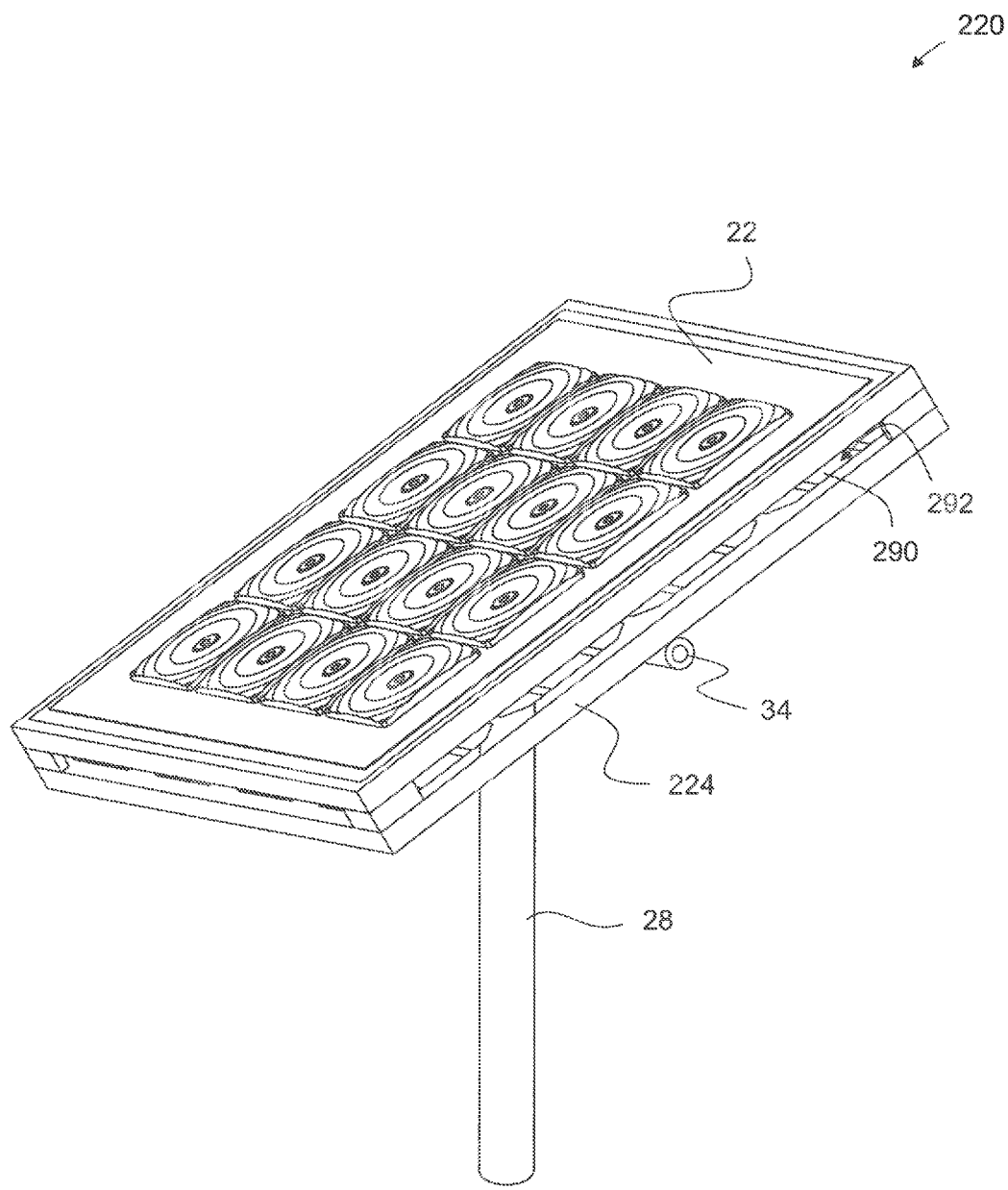
FIG. 17 is a front perspective view of still another embodiment of a photovoltaic system.
Figure 18:
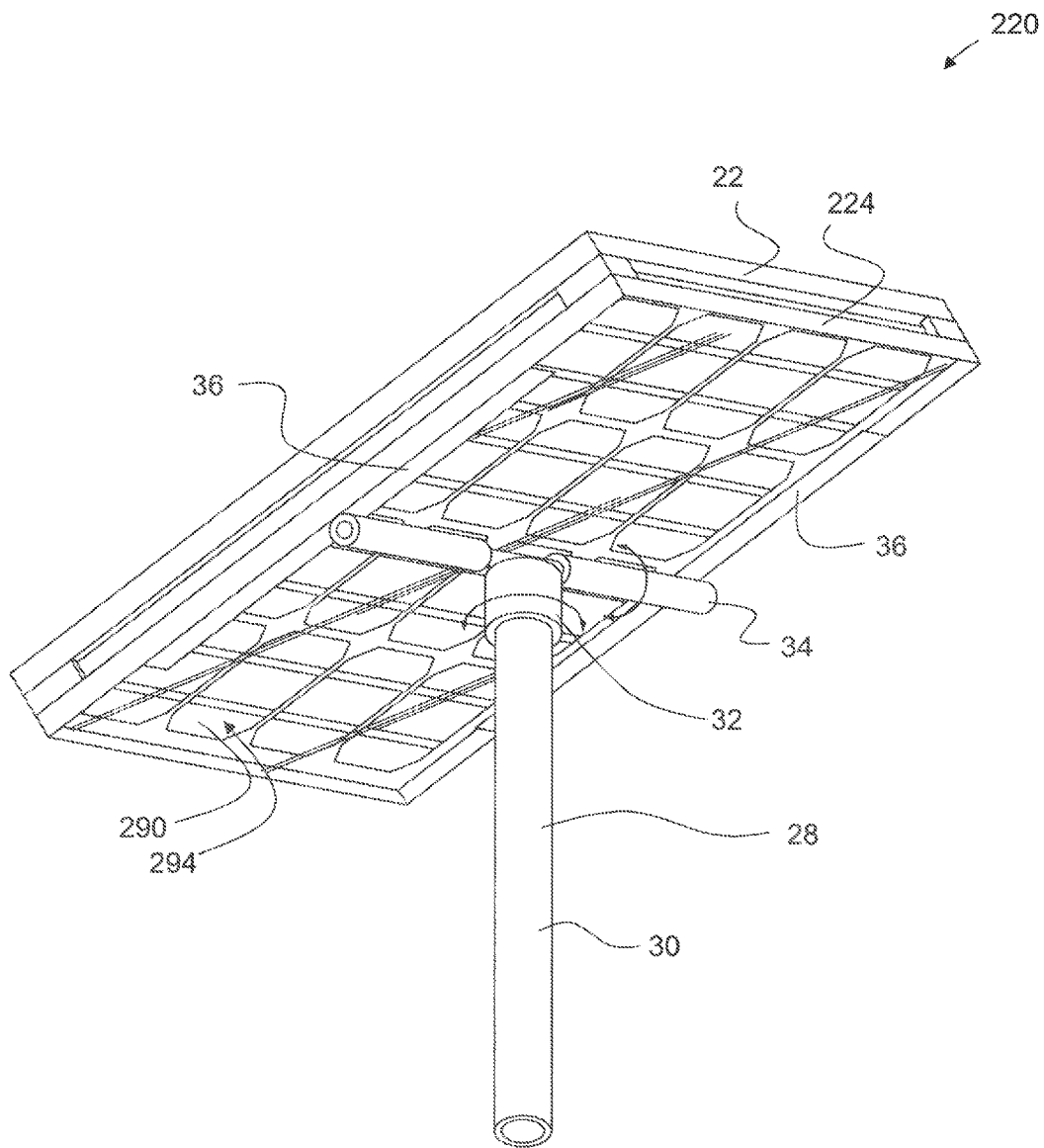
FIG. 18 is a rear perspective view of the photovoltaic system of FIG. 17.

Still other configurations are possible. FIGS. 17 and 18 show another embodiment of a photovoltaic system, which is generally indicated by reference numeral 220. Photovoltaic system 220 is generally similar to photovoltaic system 20 described above and with reference to FIGS. 1 to 14, and comprises a concentrated photovoltaic panel that is configured to collect direct light, and a non-concentrated photovoltaic panel that is configured to collect, at least, indirect light transmitted through the concentrated photovoltaic panel. Specifically, the system 120 comprises a first photovoltaic panel 22 comprising a plurality of concentrated, generally transparent photovoltaic collectors each having a first photoelectric element and being configured to collect direct light, and a second photovoltaic panel 224 comprising a plurality of second photovoltaic elements. Each second photovoltaic element is a bifacial photonic element, and has a front side configured to collect, at least, indirect light transmitted through the first photovoltaic panel, and a back side configured to collect impinging thereon, such as for example light reflected from the ground behind the second photovoltaic panel 224.

In this embodiment, the first and second photovoltaic panels 22 and 224 are mounted in fixed relation to each other in a spaced, generally parallel relationship by four (4) corner brackets 26, and the first and second photovoltaic panels 22 and 224 are sized so as to have generally the same area. The second photovoltaic panel 224 is mounted generally behind the first photovoltaic panel 22, such that indirect light transmitted through the first photovoltaic panel 22 is collected by the second photovoltaic panel 224.

The system 220 also comprises a rotating support 28 on which the first photovoltaic panel 22 and the second photovoltaic panel 24 are mounted, and which is capable of tracking movement of the sun. The rotating support 28 has been described above and with reference to FIGS. 1 to 14. As may be seen, an underside of the second photovoltaic panel 24 is mounted to the support arms 36 extending from the second rotating member 34.

The system 220 further comprises a controller unit (not shown) in communication with the rotating support 28, which is configured to control operation of the motorized first rotating member 32 and the motorized second rotating member 34 for generally orienting the first and second photovoltaic panels 22 and 224 in unison toward the sun, so as to enable direct light, and specifically direct sunlight, to be collected by the first photovoltaic panel 22.

The first photovoltaic panel 22 has been described above and with reference to FIGS. 1 to 14.

The second photovoltaic panel 224 is generally similar to the second photovoltaic panel 24 described above and with reference to FIGS. 1 to 14, but comprises a plurality of second photovoltaic elements 290, with each second photovoltaic element 290 being a conventional bifacial photovoltaic cell constructed to absorb light from a front side 292 and a back side 294. The front side and the back side 292 and 294 of the second photovoltaic element 290 are each configured to convert light absorbed therein into an electrical current by the photovoltaic effect. In this embodiment, each second photovoltaic element 290 is a monocrystalline or polycrystalline silicon bifacial photovoltaic cell and is electrically connected to a suitable conventional conductor structure (not shown) for drawing electrical current therefrom.

The system 220 further comprises a system power circuit (not shown) that is electrically connected to the bus bars 74 and 75 of the first photovoltaic panel 22 for drawing electrical current therefrom, and to the conventional conductor structure of the second photovoltaic panel 224 for drawing electrical current therefrom. The system power circuit is electrically connected to a conventional electrical storage structure (not shown) configured to store at least some of the drawn electrical current, and/or is electrically connected to a conventional power distribution grid (not shown). The conventional electrical storage structure may comprise, for example, one or more batteries.

In use, the motorized first and second rotating members 32 and 34 of the rotating support 28 are rotated by the controller unit such that the front side of the first photovoltaic panel 22 is generally oriented toward the sun, so as to enable direct light, and specifically direct sunlight, to be collected by the first photovoltaic panel 22, in the manner described above and with reference to FIGS. 1 to 14. Each first photovoltaic element 48 absorbs light impinging thereon and generates an electrical current. The electrical current generated by the first photovoltaic elements 48 is drawn from the first photovoltaic panel 22 through the conductor grid 46 via the positive and negative bus bars 74 and 75 to the system power circuit. At least some indirect light transmitted through the first photovoltaic panel 22 impinges on a front side of the second photovoltaic panel 224, and in particular on the front side 292 of the second photovoltaic elements 290. Other light, such as for example light reflected from the ground, impinges on a back side of the second photovoltaic panel 224, and in particular on the back side 294 of the second photovoltaic elements 290. The front and back sides 292 and 294 absorb light impinging thereon and generate an electrical current. The electrical current generated by the second photovoltaic elements 290 is drawn from the second photovoltaic panel 224 through conventional conductor structure to the system power circuit.

As will be appreciated, the system 220 is suitable for use on ground having a relatively high natural reflectivity, such as for example snow or sand, and in particular white sand. The ground may also be coated with a reflective material such as white paint or reflective paint. In some embodiments a reflective tarp may be laid down on the ground, or white stones may also be suitable ground reflectors.

Figure 19:
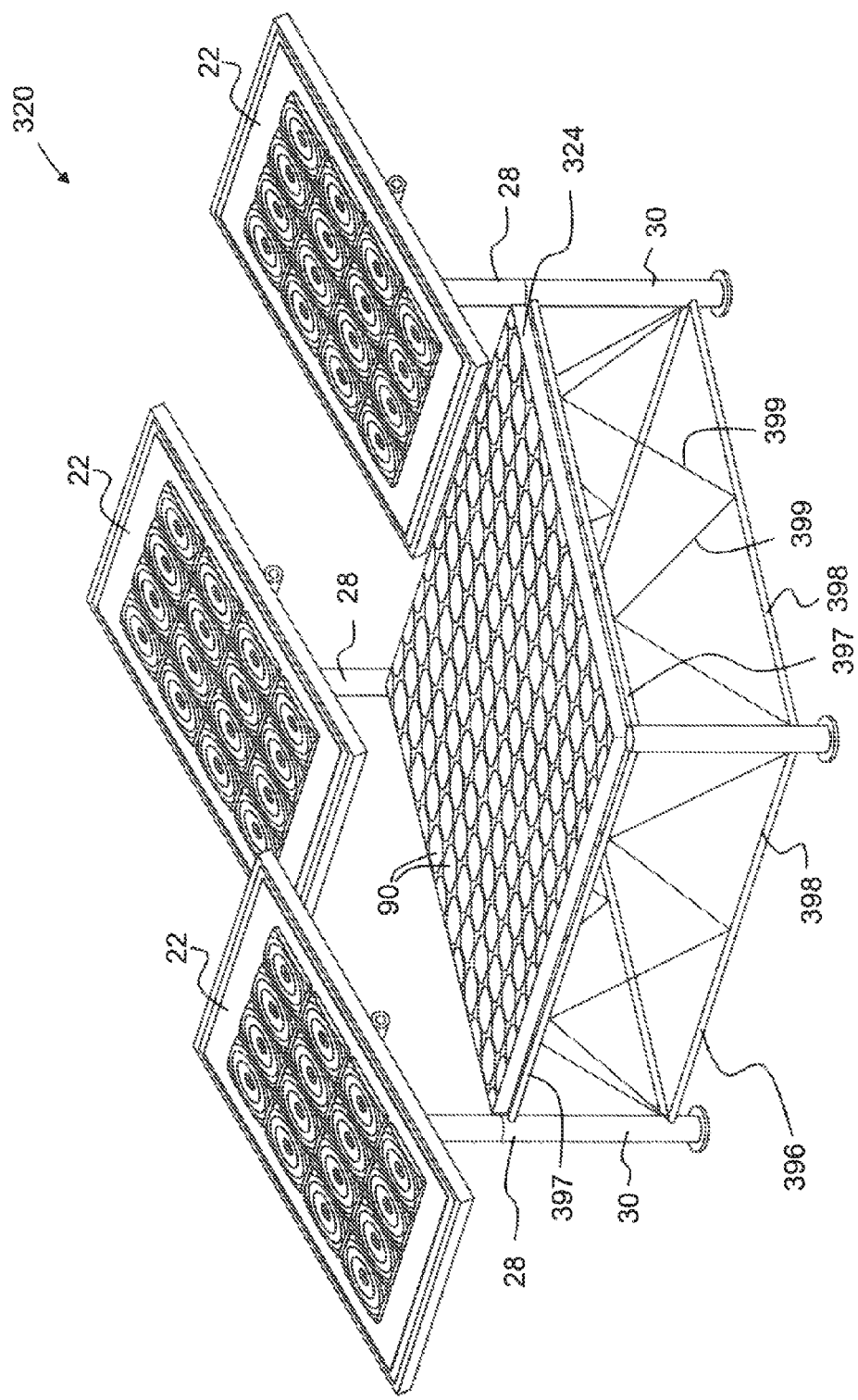
FIG. 19 is a perspective view of a portion of still yet another embodiment of a photovoltaic system.

Still other configurations are possible. FIG. 19 shows another embodiment of a photovoltaic system, which is generally indicated by reference numeral 320. Photovoltaic system 320 is generally similar to photovoltaic system 20 described above and with reference to FIGS. 1 to 14, and comprises a plurality of concentrated photovoltaic panels configured to collect direct light, and one or more non-concentrated photovoltaic panels configured to collect, at least, indirect light transmitted through one or more of the concentrated photovoltaic panels. Specifically, the system 320 comprises a plurality of first photovoltaic panels 22 each comprising a plurality of concentrated, generally transparent photovoltaic collectors each having a first photoelectric element and being configured to collect direct light, and at least one second photovoltaic panel 324 comprising a plurality of second photovoltaic elements configured to collect, at least, indirect light transmitted through the first photovoltaic panel. Each second photovoltaic panel 324 is mounted generally behind the first photovoltaic panel 22, such that indirect light transmitted through one or more of the first photovoltaic panels 22 is collected by the second photovoltaic panel 324. In this embodiment, each first photovoltaic panels 22 is mounted in a non-fixed relation relative to the at least one second photovoltaic panel 324.

The system 320 further comprises a plurality of rotating supports 28, with each first photovoltaic panel 22 being mounted on a respective rotating support 28. Each rotating support 28 is configured to be rotated during use such that a front side of the first photovoltaic panel 22 is generally oriented toward the sun during at least some daylight hours, so as to enable direct light, and specifically direct sunlight, to be collected by the first photovoltaic panel 22. Each rotating support 28 comprises a longitudinal support post 30, atop of which is coupled a motorized first rotating member 32 configured to move rotatably about a first axis (not shown), and a motorized second rotating member 34 coupled to the first rotating member 32 and configured to move rotatably about a second ax (not shown). Two (2) support arms 36 extend from the second rotating member 34, and provide surfaces to which an underside of the first photovoltaic panel 22 is mounted.

The system 320 further comprises a controller unit (not shown) in communication with the rotating supports 28, which is configured to control operation of the motorized first rotating member 32 and the motorized second rotating member 34 of each rotating support 28 for generally orienting the plurality of first photovoltaic panels 22 toward the sun, so as to enable direct light, and specifically direct sunlight, to be collected by each first photovoltaic panel 22.

The system further comprises at least one ground support stand 396 coupled to the rotating supports 28 on which the at least one second photovoltaic panel 324 is mounted in a fixed position. In the embodiment shown, the system 320 comprises one (1) second photovoltaic panel 324 mounted on the ground support stand 396 generally horizontally and in a fixed position relative to the ground. Additionally, in this embodiment, the ground support stand 396 comprises a generally light-weight frame construction, and comprises a plurality of upper support rods 397 and a plurality of lower support rods 398 that are connected by a plurality of diagonal braces 399 and by the support posts 30 of the rotating supports 28. The ground support stand 396 may be, for example, a box frame similar to that sold by Morgan Solar Inc. of Toronto, Ontario, Canada, under the name "Savanna".

The first photovoltaic panel 22 has been described above and with reference to FIGS. 1 to 14.

The second photovoltaic panel 324 is generally similar to the second photovoltaic panel 24 described above and with reference to FIGS. 1 to 14, but is further configured to be mounted to the ground support stand 396.

The system 320 further comprises a system power circuit (not shown) that is electrically connected to the bus bars 74 and 75 of each of the first photovoltaic panels 22 for drawing electrical current therefrom, and to the conventional conductor structure of the at least one second photovoltaic panel 324 for drawing electrical current therefrom. The system power circuit is electrically connected to a conventional electrical storage structure (not shown) configured to store at least some of the drawn electrical current, and/or is electrically connected to a conventional power distribution grid (not shown). The conventional electrical storage structure may comprise, for example, one or more batteries.

In use, the motorized first and second rotating members 32 and 34 of each rotating support 28 are rotated by the controller unit such that the front side of each of the first photovoltaic panels 22 are generally oriented toward the sun, so as to enable direct light, and specifically direct sunlight, to be collected by the first photovoltaic panel 22, in the manner described above and with reference to FIGS. 1 to 14. Each first photovoltaic element 48 absorbs light impinging thereon and generates an electrical current. The electrical current generated by the first photovoltaic elements 48 is drawn from each first photovoltaic panel 22 through the conductor grid 46 via the positive and negative bus bars 74 and 75 to the system power circuit. At least some indirect light transmitted through one or more of the first photovoltaic panels 22 impinges on a front side of the second photovoltaic panel 324. The second photovoltaic elements 90 of the second photovoltaic panel 324 absorb light impinging thereon and generate an electrical current. The electrical current generated by the second photovoltaic elements 90 is drawn from the second photovoltaic panel 324 through conventional conductor structure to the system power circuit.

Still other configurations are possible. For example, those skilled in the art will understand that the configuration of the first photovoltaic panel is not limited to that described above, and in other embodiments, the first photovoltaic panel may alternatively have a different configuration. For example, other configurations of first photovoltaic panel are disclosed in U.S. application Ser. No. 14/196,618 filed on Mar. 4, 2014, assigned to Morgan Solar Inc. of Toronto, Ontario, Canada, assignee of the subject application, the entire content of which is incorporated herein by reference in its entirety. In still other embodiments, the system may alternatively comprise any suitable first photovoltaic panel comprising a plurality of concentrated, generally transparent photovoltaic collectors.

Although in the embodiments described above, the first photovoltaic panel comprises sixteen (16) concentrated photovoltaic collectors arranged in a four-by-four (4×4) array, in other embodiments the first photovoltaic panel may alternatively comprise fewer or more concentrated photovoltaic collectors. For example, in one embodiment, the first photovoltaic panel may alternatively comprise four-hundred and eighty (480) concentrated photovoltaic collectors arranged in a twelve-by-forty (12×40) array. In still other embodiments, the first photovoltaic panel may alternatively comprise only one (1) concentrated photovoltaic collector.

Although in the embodiments described above, the first optical element comprises three (3) lenses, in other embodiments, the first optical element may alternatively comprise fewer or more lenses.

Although in the embodiments described above, the first optical element is shaped so as to comprise a plurality of generally ring-shaped lenses that are arranged in a concentric manner, in other embodiments, the lenses of the first optical element may alternatively have a different shape and/or configuration.

Although in the embodiments described above, the second optical element comprises three (3) annular reflecting surfaces, in other embodiments, the second optical element may alternatively comprise fewer or more annular reflecting surfaces.

Although in the embodiments described above, the second optical element is shaped so as to comprise a plurality of annular reflecting surfaces that are arranged in a concentric manner, in other embodiments, the reflecting surfaces of the second optical element may alternatively have a different shape and/or configuration. For example, in one such embodiment, the reflecting surfaces may alternatively be planar surfaces arranged in one or more ring-shaped patterns.

Although in the embodiments described above, the first and second rigid sheets are fabricated of glass, in other embodiments, the first and second rigid sheets may alternatively be fabricated of other suitable light-transmissive materials. For example, in other embodiments, the first and second sheets may alternatively be fabricated of rigid, injection molded PMMA, polymethyl methacrylimide (PMMI), polycarbonates, cyclo olefin polymers (COP), cyclo olefin copolymers (COC), polytetrafluoroethylene (PTFE), or a combination thereof.

Although in the embodiments described above, the first optical element and the second optical element are fabricated of injection molded PMMA, in other embodiments, one or both of the first optical element and the second optical element may alternatively be fabricated of another suitable light-transmissive material. For example, in other embodiments, one or both of the first optical element and the second optical element may alternatively be fabricated of light-transmissive polymeric materials such as glass, or rigid, injection molded polymethyl methacrylimide (PMMI), polycarbonates, cyclo olefin polymers (COP), cyclo olefin copolymers (COC), polytetrafluoroethylene (PTFE), or a combination thereof, or a silicone rubber such as silicone having hardness, when cured, of at least 20 Shore A.

Although in the embodiments described above, the first and second compliant layers are fabricated of silicone, in other embodiments, one or both of the first and second compliant layers may alternatively be fabricated of one or more other suitable elastomeric material. For example, in other embodiments, the first and second compliant layers may alternatively be fabricated of ethylene-vinyl acetate or an ionomer.

Although in the embodiments described above, the conductor grid is fabricated of copper, in other embodiments, the conductor grid may alternatively be fabricated of any material that is suitably electrically conductive and suitably thermally conductive. For example, and without being limited thereto, in other embodiments the conductor grid may alternatively be fabricated of another conductive metal such as gold, silver or aluminum, a conductive metal alloy, a polymer loaded with a conductive metal or conductive metal alloy, and the like.

Although in the embodiments described above, the conductor grid is stamped copper foil that is bonded to the first rigid sheet by adhesive, in other embodiments, other configurations may be used. For example, in other embodiments, the conductor grid may alternatively be applied to a surface of the rigid sheet by any suitable metallization process, which could, for example, include sputtering, galvanizing or screen printing a thick film. In other embodiments, conductors such as wires, ribbons and/or foils, may alternatively be attached to the rigid sheet by soldering the conductors to metallizations on the rigid sheet (e.g., metallized dots).

Although in the embodiments described above, the panel comprises a first rigid sheet and a second rigid sheet, in other embodiments, the panel may alternatively comprise only a single rigid sheet. For example, in one such embodiment, the panel may alternatively comprise one or more first optical elements, an elastomeric compliant layer, a single rigid sheet, a conductor grid, one or more photovoltaic elements, an intermediate layer, and one or more second optical elements, all of which are arranged in a generally stacked manner, and with the one or more second optical elements being generally disposed on, and attached to, the intermediate layer. Other configurations comprising a single rigid sheet are possible, with the one or more first optical elements being disposed adjacent a first side of the single rigid sheet, and with the one or more second optical elements being disposed adjacent a second side of the at least one rigid sheet.

In other embodiments, each receiver may alternatively include a bypass diode to improve the performance of the panel in the event of shading of one or more photovoltaic elements, or when differences in optical efficiency exist between photovoltaic elements.

The invention also contemplates an apparatus that comprises the first photovoltaic panel(s), the second photovoltaic panel(s), the mounting brackets (if any), and the rotating support(s) of any of the embodiments described above.

Although embodiments have been described above with reference to the accompanying drawings, those of skill in the art will appreciate that variations and modifications may be made without departing from the scope thereof as defined by the appended claims.

What is claimed is:

1. A photovoltaic system comprising:
a concentrating photovoltaic panel configured to concentrate direct light towards at least one photovoltaic cell; and
a non-concentrating photovoltaic panel configured to collect, at least, indirect light transmitted through the concentrating photovoltaic panel,
wherein the concentrating photovoltaic panel comprises:
at least one rigid sheet;
one or more first optical elements disposed adjacent a first side of the at least one rigid sheet;
one or more second optical elements disposed adjacent a second side of the at least one rigid sheet; and
one or more photovoltaic elements, each photovoltaic element disposed between a respective first optical element and a respective second optical element, each first optical element comprising at least one lens configured to focus light impinging thereon onto a corresponding reflecting surface of the respective second optical element, each second optical element being configured to reflect light focused by the first optical element to the photovoltaic element.

2. The system of claim 1, wherein the concentrating photovoltaic panel comprises one or more multi junction photovoltaic elements.

3. The system of claim 1, wherein the non-concentrating photovoltaic panel comprises one or more silicon photovoltaic elements.

4. The system of claim 1, wherein the concentrating photovoltaic panel is mounted on a rotating support configured for sun tracking.

5. The system of claim 4, wherein the non-concentrating photovoltaic panel is mounted in a fixed relationship relative to the ground.

6. The system of claim 5, wherein the non-concentrating photovoltaic panel is mounted to a support post of a rotating support.

7. The system of claim 5, further comprising a ground support stand supporting the non-concentrating photovoltaic panel.

8. The system of claim 4, wherein the non-concentrating photovoltaic panel is mounted adjacent a back side of the concentrating photovoltaic panel, the concentrating photovoltaic panel and the non-concentrating photovoltaic panel being mounted on the rotating support.

9. The system of claim 8, wherein the non-concentrating photovoltaic panel comprises one or more bifacial photovoltaic elements.

10. The system of claim 9, wherein each bifacial photovoltaic element comprises a first photonic element on a front side thereof, and a non-concentrating photonic element on a back side thereof, the non-concentrating photovoltaic panel being mounted such that the non-concentrating photonic element is oriented away from the first photovoltaic panel.

11. The system of claim 10, wherein the back side is configured to collect light reflected from the ground.

12. The system of claim 1, wherein the at least one lens is configured to focus direct light impinging thereon onto the corresponding reflecting surface of the respective second optical element.

13. The system of claim 1, wherein the at least one lens comprises a generally ring-shaped, plano-convex lens arranged concentrically about a central axis of the first optical element.

14. The system of claim 13, wherein the at least one lens comprises a plurality of generally ring-shaped, plano-convex lenses arranged concentrically about the central axis.

15. The system of claim 1, further comprising a structure configured to conduct heat away from each photovoltaic element.

16. The system of claim 1, further comprising a plurality of concentrating photovoltaic panels, each first photovoltaic panel configured to collect direct light.

17. The system of claim 16, further comprising a plurality of rotating supports, each concentrating photovoltaic panel being mounted on a respective rotating support.

18. The system of claim 1, wherein at least one of the one or more photovoltaic elements is a multi junction photovoltaic element.

* * * * *